United States Patent [19]

Yamada

[11] Patent Number: 5,345,099
[45] Date of Patent: Sep. 6, 1994

[54] SEMICONDUCTOR DEVICE

[75] Inventor: Takahiro Yamada, Hirakata, Japan

[73] Assignee: Matsushita Electric Industrial Co., Ltd., Kadoma, Japan

[21] Appl. No.: 56,627

[22] Filed: May 4, 1993

[30] Foreign Application Priority Data

Oct. 6, 1992 [JP] Japan .................... 4-267665

[51] Int. Cl.⁵ .................... H01L 29/78; H01L 27/14; H01L 31/00
[52] U.S. Cl. .................... 257/250; 257/38; 257/39; 257/222; 257/224; 257/232; 257/233; 257/242; 257/243; 348/249; 348/311
[58] Field of Search .................... 257/37, 38, 39, 222, 257/224, 223, 229, 232, 233, 240, 242, 243, 250; 358/213.22, 213.23, 213.24, 213.29

[56] References Cited

U.S. PATENT DOCUMENTS 4,878,102  10/1989  Bakker et al. .................... 257/242

OTHER PUBLICATIONS

"Amorphous-silicon charge-coupled devices", Satoru Kishida et al, Applied Physics Letter, vol. 41 (No. 12), Dec. 15, 1982, pp. 1154–1156.
Carlo H. Sequin, et al: "Charge Transfer Device", published by Academic Press, Inc., in 1975; pp. 1-pp. 55.

*Primary Examiner*—Ngan Van Ngo
*Attorney, Agent, or Firm*—Cushman, Darby & Cushman

[57] ABSTRACT

In a CCD device, on a semiconductor substrate, and in the insulation films, plural first semiconductor regions and plural second semiconductor regions are formed buried in the insulation films, intermediating a tunneling insulation film therebetween in a manner to spatially isolate them from each other.

7 Claims, 29 Drawing Sheets

FIG. 3  Thermal equilibrium state
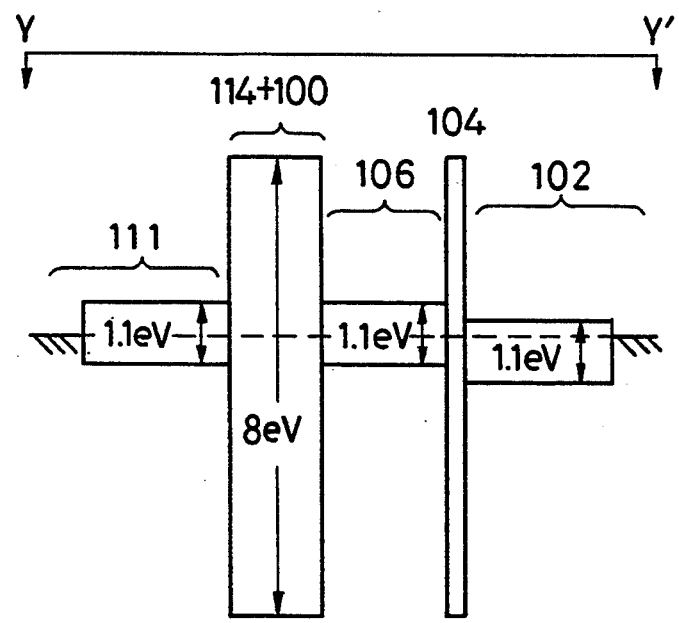
FIG. 4  Writing state
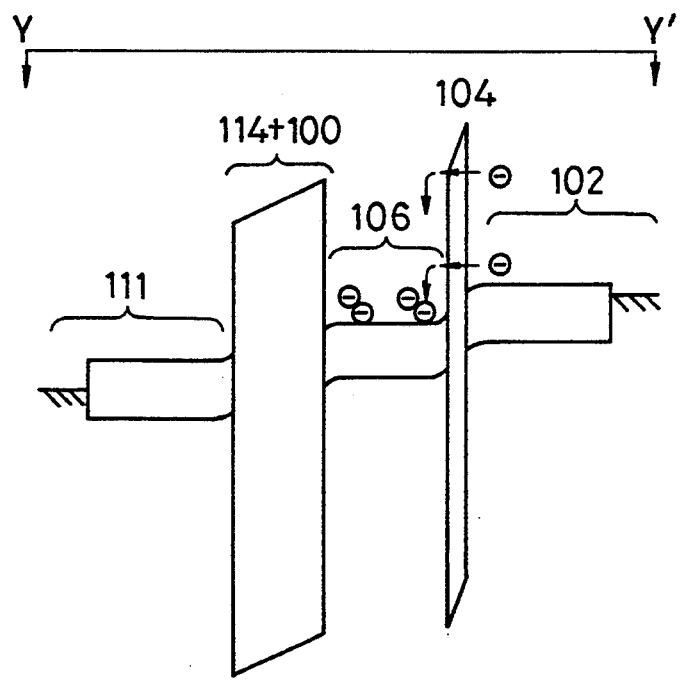

FIG. 5  Stored state
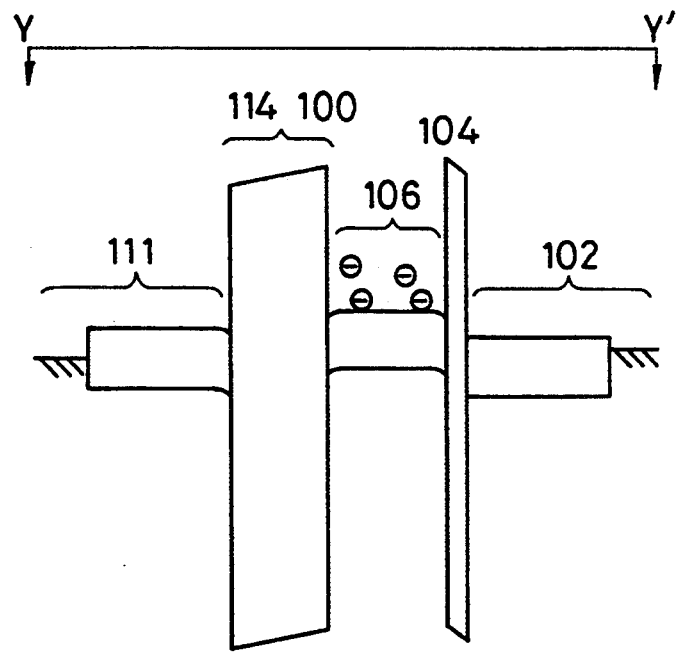
FIG. 6  Discharging state
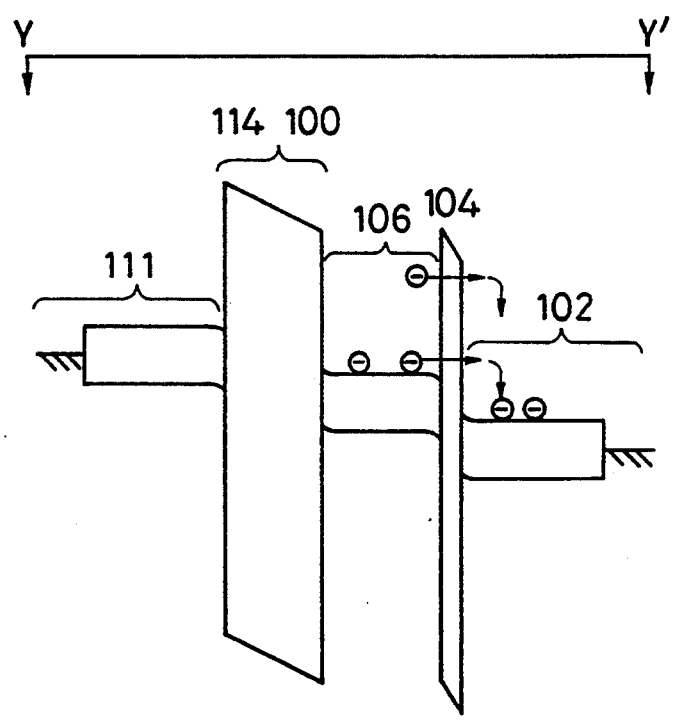

FIG. 7  Thermal equilibrium state
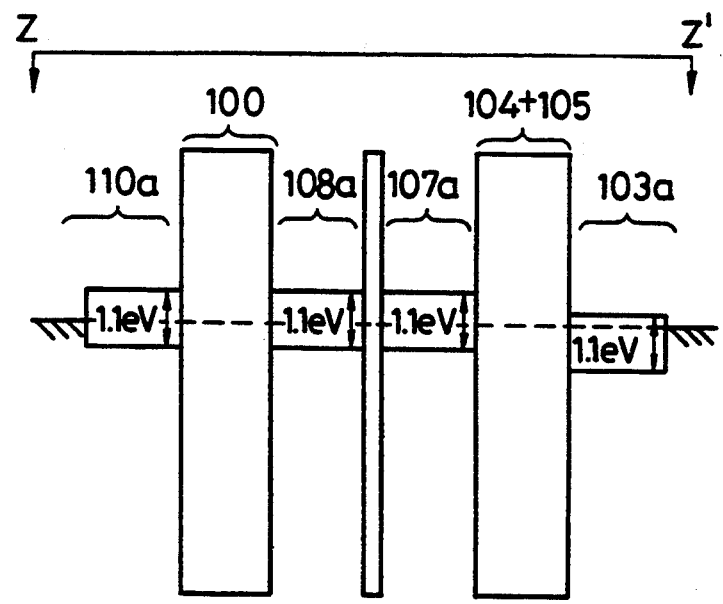
FIG. 8  Transferring state
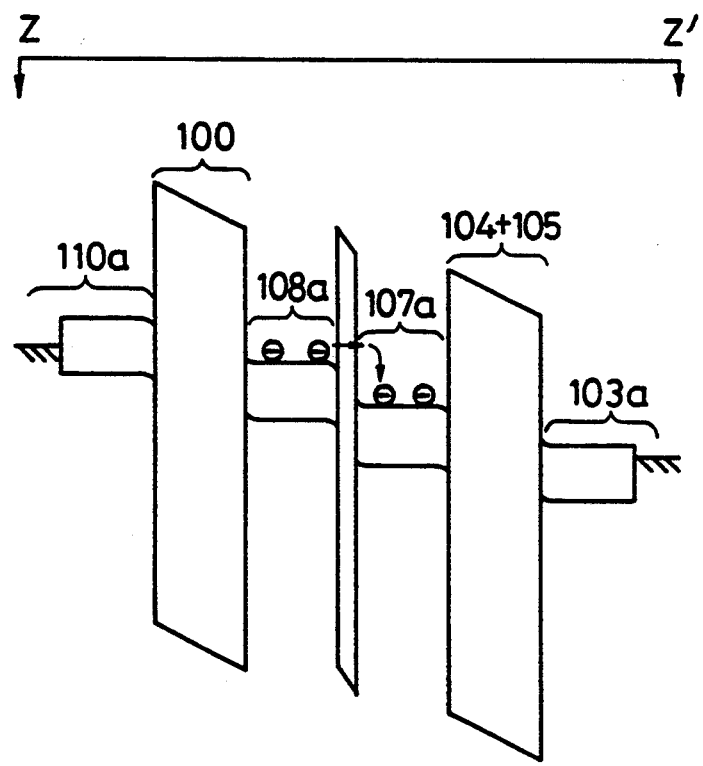

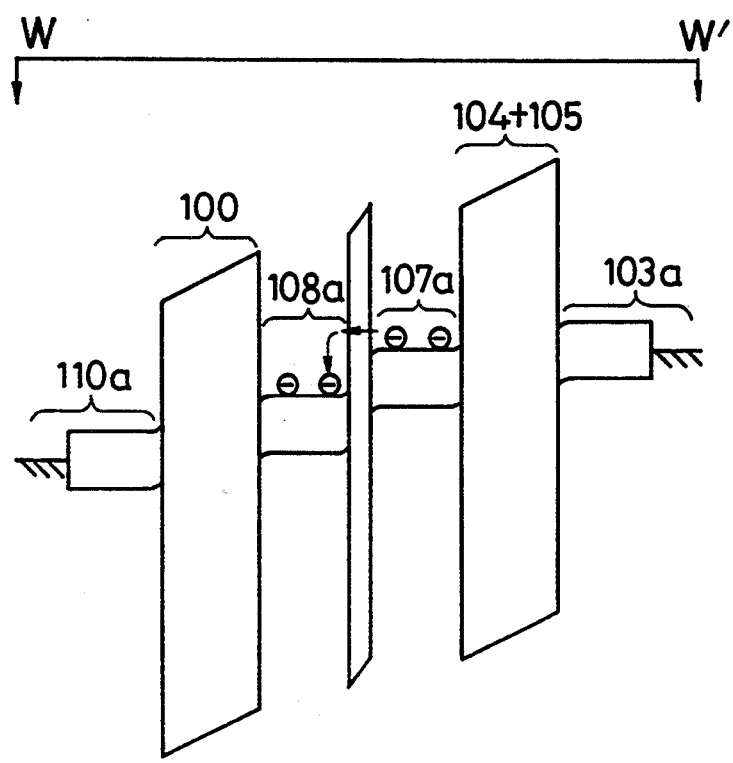
FIG. 9  Transferring state

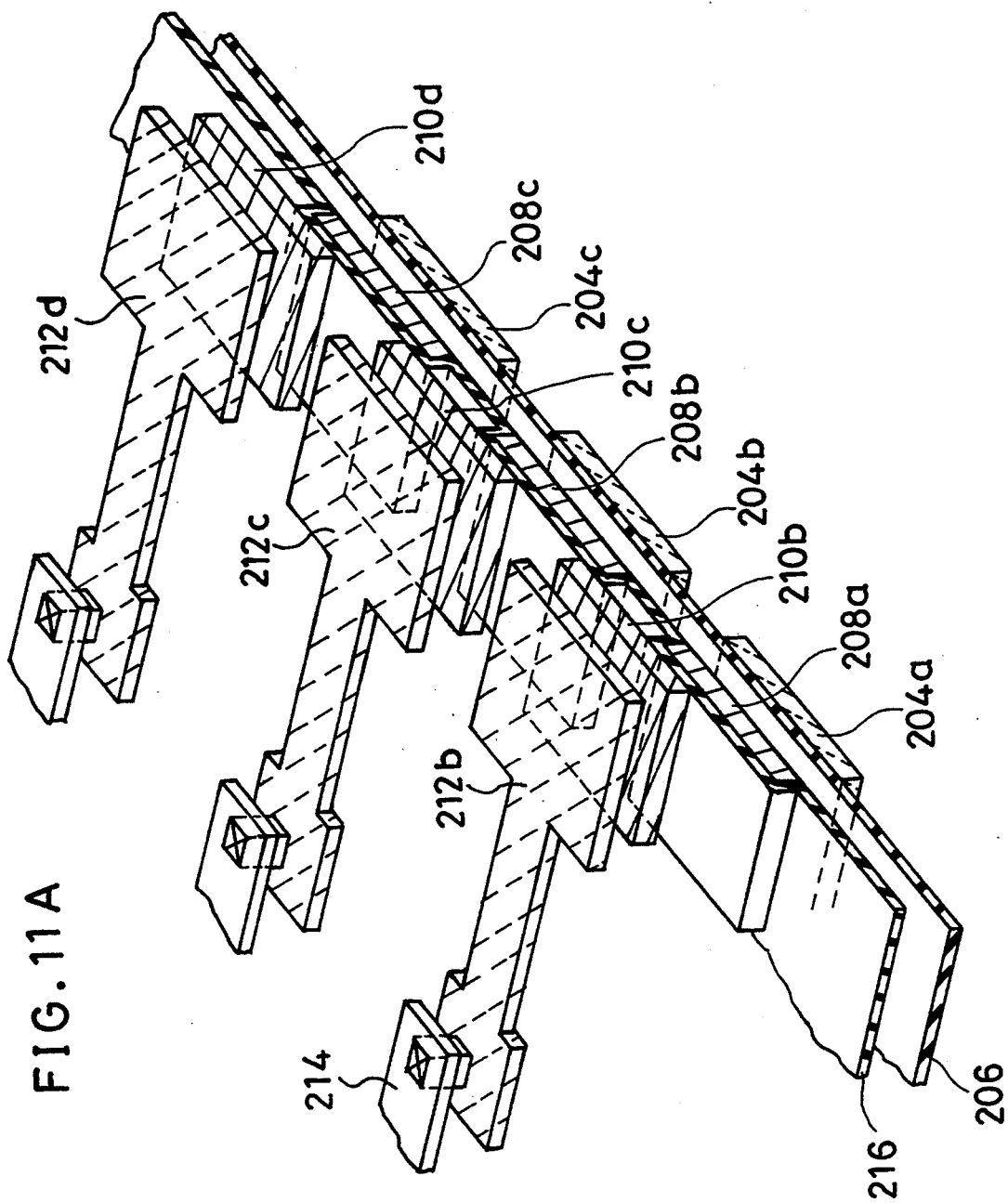

FIG. 14  Thermal equilibrium state
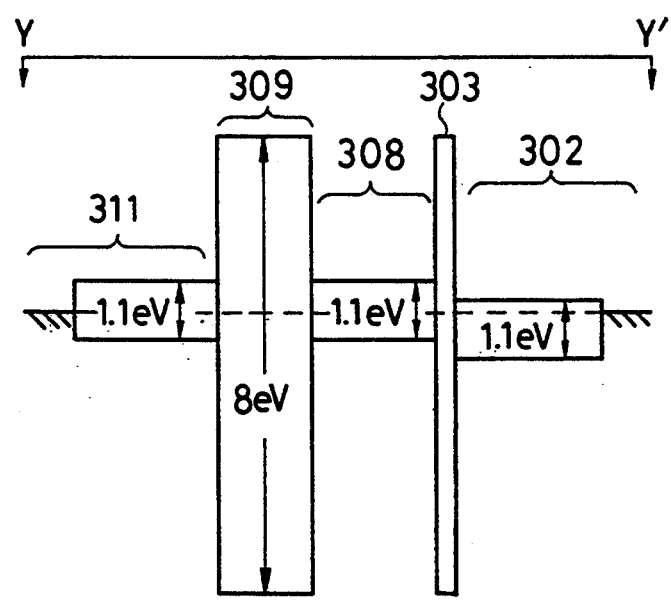
FIG. 15  Writing state
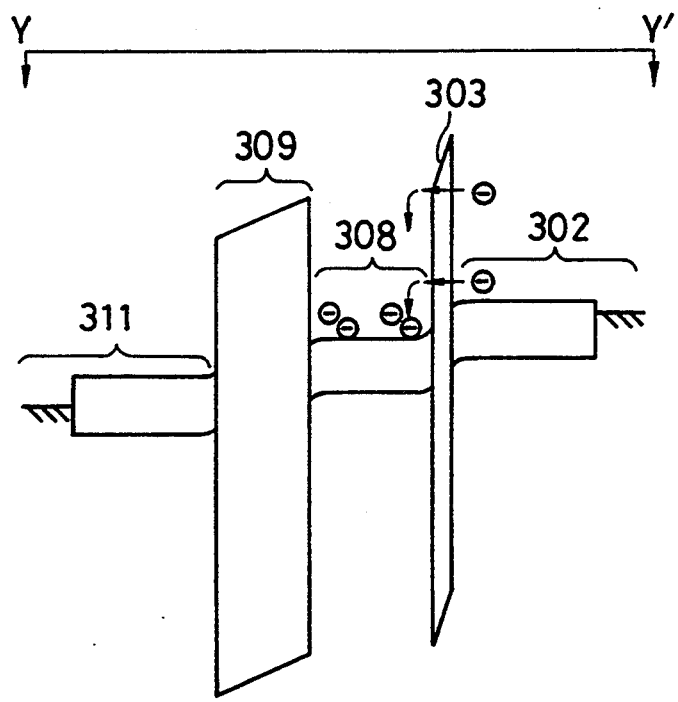

FIG. 16  Stored state
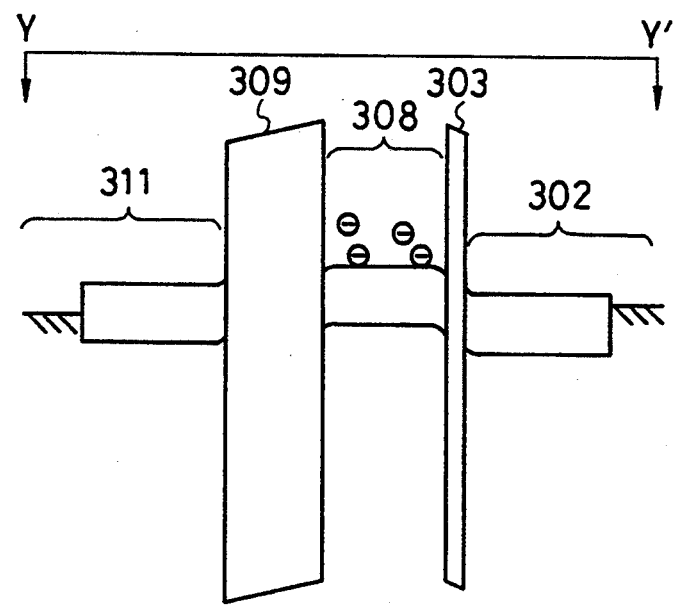
FIG. 17  Discharging state
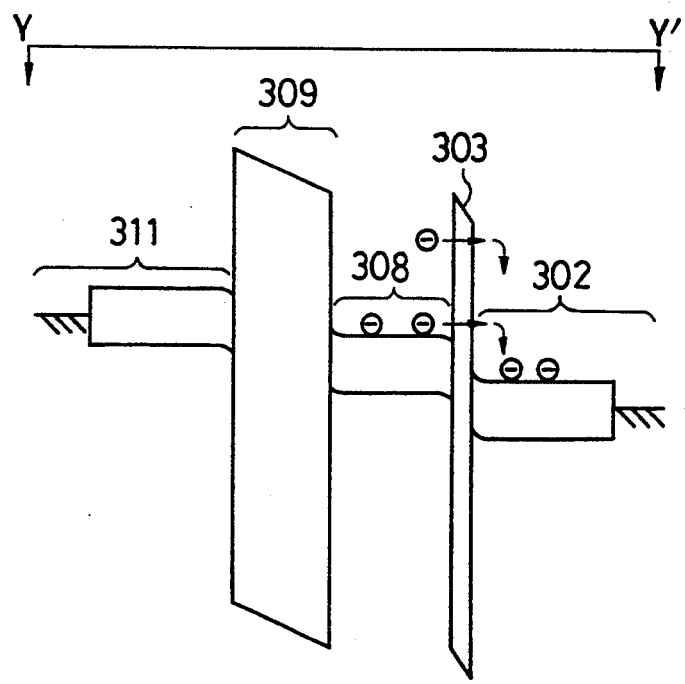

FIG. 18   Thermal equilibrium state
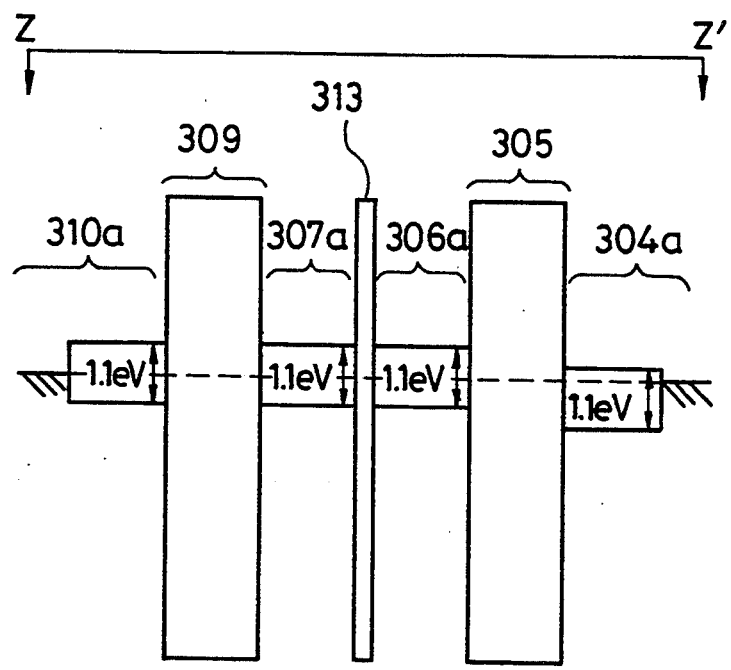
FIG. 19   Transferring state
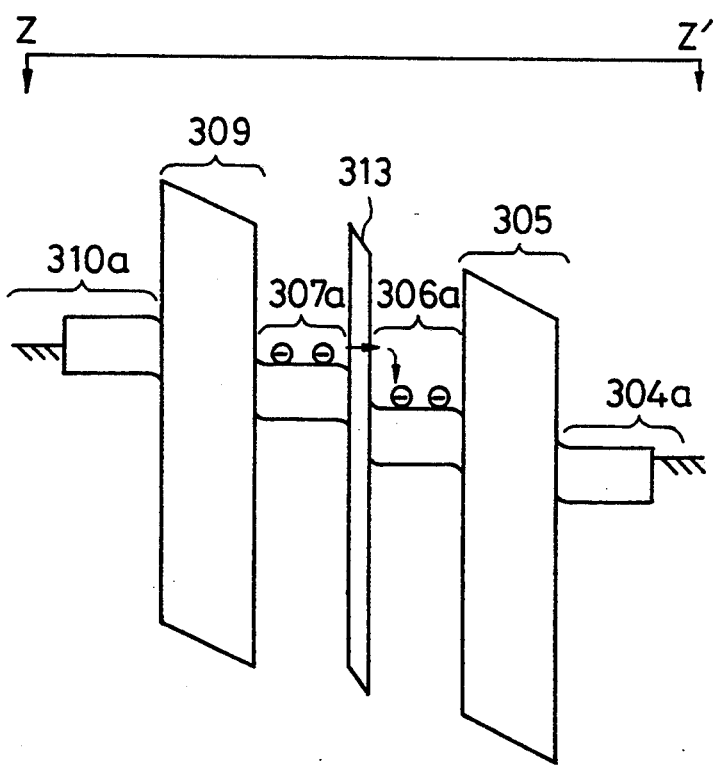

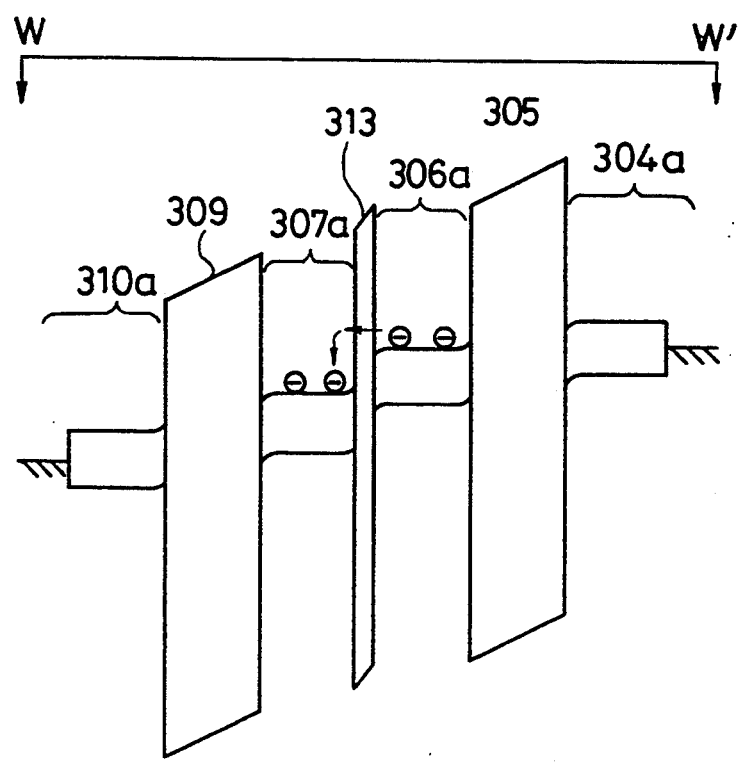
FIG. 20  Transferring state

FIG. 23    Thermal equilibrium state
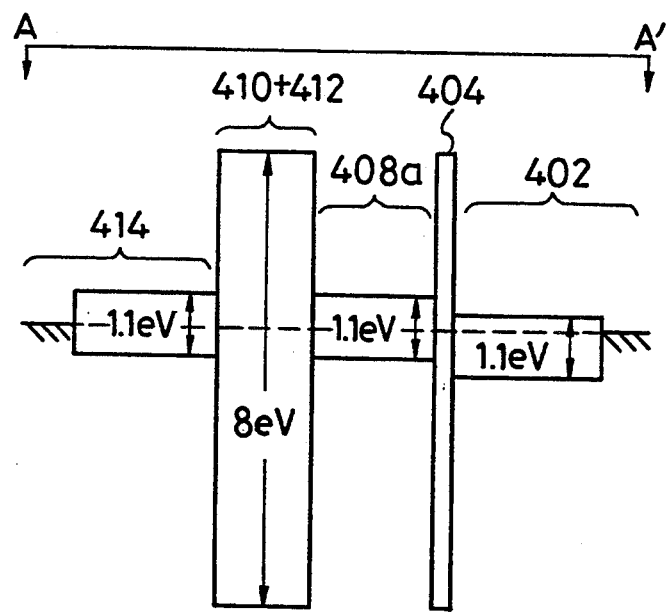
FIG. 24    Writing state
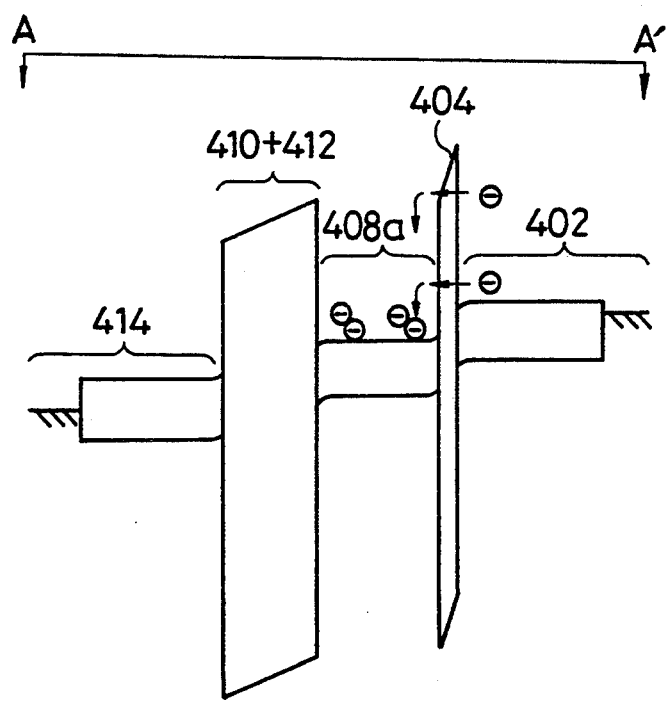

FIG. 25  Stored state
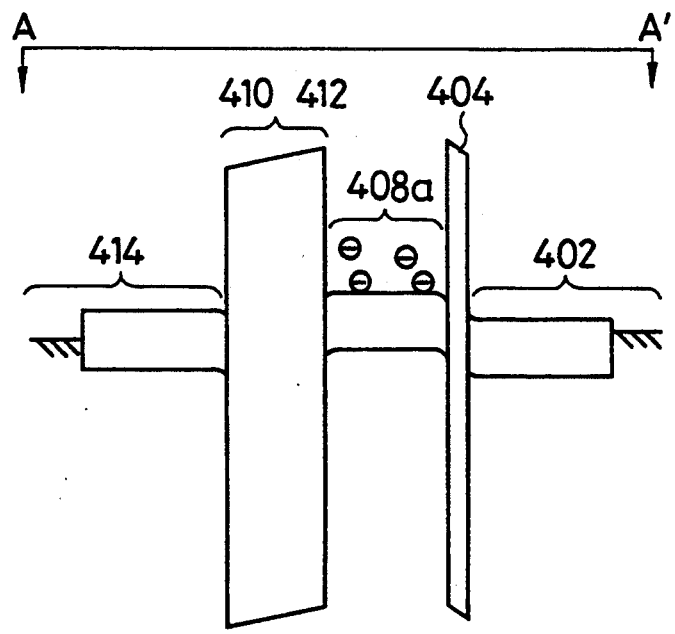
FIG. 26  Discharging state
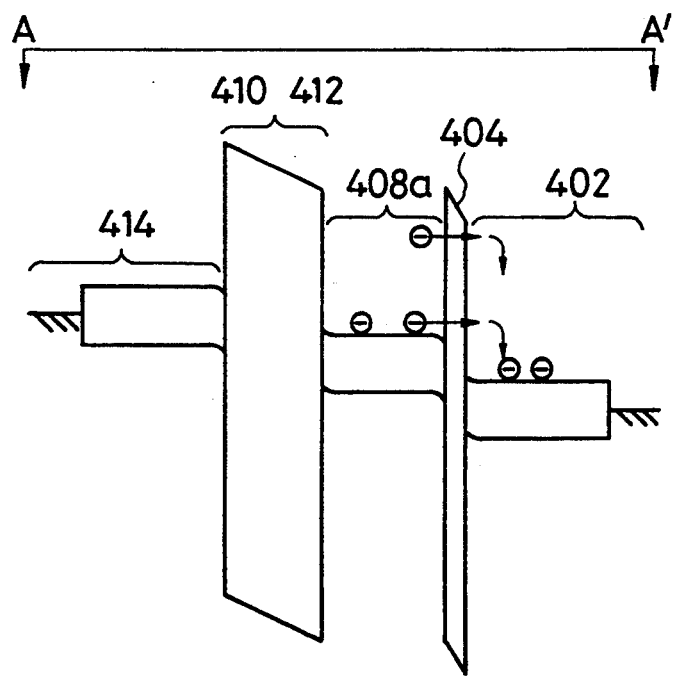

FIG. 27  Thermal equilibrium state
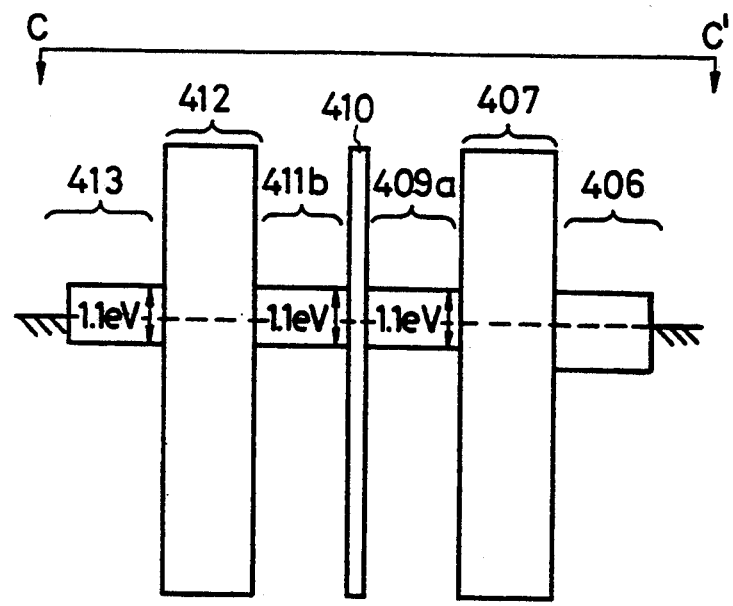
FIG. 28  Transferring state
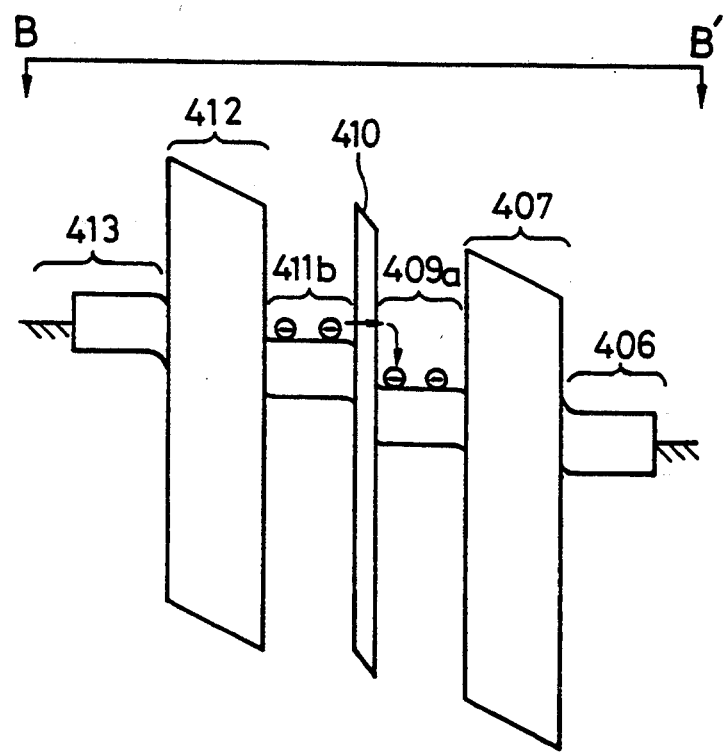

FIG. 29  Transferring state
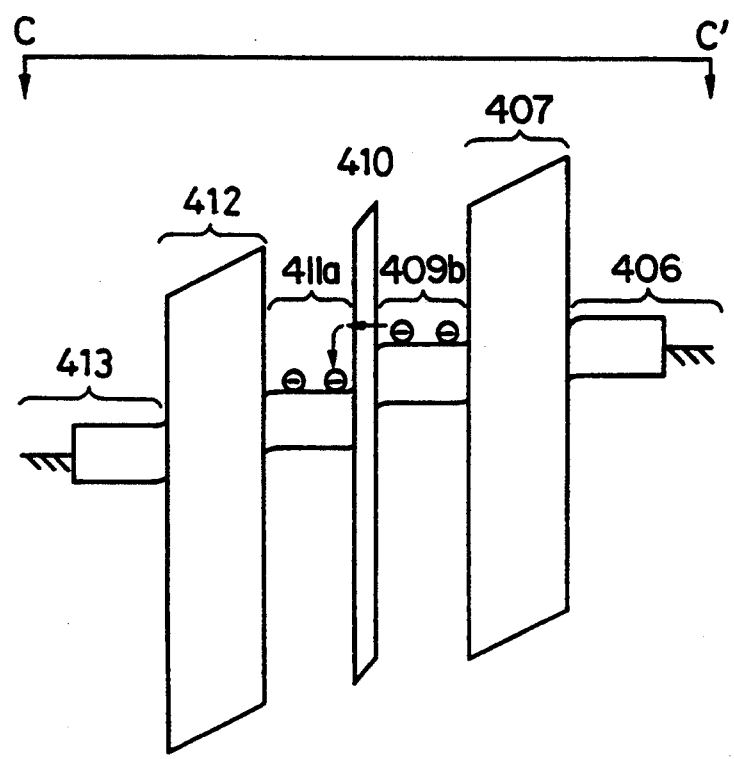

SEMICONDUCTOR DEVICE

FIELD OF THE INVENTION AND RELATED ART STATEMENT

1. FIELD OF THE INVENTION

The present invention relates to a novel stacked channel type charge transfer device, wherein electric charges are transferred by tunneling effect through plural semiconductor regions, which are embedded in insulation films formed on a semiconductor substrate.

2. DESCRIPTION OF THE RELATED ART

Almost of all of the solid state imaging devices widely used in home use movie cameras and various video cameras are charge transfer devices which are also called planar channel type CCD (See e.g.: C. H. Sequin & M. F. Tompsett, "Charge Transfer Device" Academic Press 1975, U.S.A.)

An example configuration of the most fundamental type of conventional surface channel CCD is shown in FIG. 33, wherein the device comprises a plurality of poly-Si gate electrodes 603, 604, 605, --- on a gate oxide film 602 of thickness $T_{ox}$ (usually of 500 to 600 thick $SiO_2$), which is formed on a p-type Si substrate 601.

The retaining or storing of a signal charge in this CCD is carried out by applying a positive potential to the gate electrode 604, thereby storing the signal charge in a depletion layer 606 generated by the potential.

A transfer of the signal charge is made, as shown in FIG. 34, by applying to the gate electrode 605 a higher potential than that to the gate electrode 604, thereby transferring the signal charge to the depletion region 607 of deeper potential.

Hereupon, when higher integration or size reduction of such CCD of the conventional planar channel type is intended, the distance or gap between the photo-diode parts and the parallelly provided CCD parts must be decreased. Because of such decrease in the gap, the light windows of a mask, which is provided on the CCD to cover the CCD parts, come nearer to the CCD parts. Therefore, any incident light which slants through the light window easily enter the CCD parts, thereby inducing an undesirable generation of a smear charge and hence a spurious charge transfer in the CCD parts.

The conventional planar channel type CCD has another problem of antinomy between achieving a greater dynamic range (i.e higher S/N ratio) and achieving a higher sensitivity under a high integration. In order to achieve a greater dynamic range, the maximum amount of transferable electric charge must be made as large as possible, and such a large transferable charge requires a large width of the transfer channel parts. On the other hand, the achievement of a higher sensitivity requires a broader area of each photodiode part of the device, with a limited highly integrated small area for both parts. For years, the development to a higher integration of a conventional planar channel CCD has been made by the utilization of high integration technology in the manufacturing of DRAM devices. Therefore, the integration of the planar channel type CCD followed the integration of DRAM devices for many years.

However, more recently the high integration of the CCD encountered a technical barrier because of the above-mentioned antinomy; and the designs of such planar channel type CCD's are making a trade-off between the width of the transfer channel and the photodiode parts. In the following, this situation is elucidated a little more in detail, referring to FIGS. 35 and 36 showing an example of the prior art.

FIG. 35 is a plan view showing an example of the conventional inter-line type CCD imaging device which is most typical among CCD imaging devices. As shown in FIG. 35, the inter-line type CCD comprises a light receiving part 703 consisting of photoelectric transducing regions 701, and vertical CCD parts 702, a horizontal CCD part 704 and an output amplifier 705. FIG. 36 shows an enlarged cross section of the light receiving part, wherein an $n^+$-type region 707 formed on the principal face of a p-type substrate 706 constitutes the photoelectric transducing region 701, and a high resistance $n^-$-type region 708 and the transfer electrode 709 together constitute the vertical CCD parts 702. Hereupon, when a higher integration is intended to retain substantially the same area of the light receiving part 703 of this CCD imaging device, namely retaining the optical lens system used therefore as it is, there arises a severe problem in how the areas for the photoelectric transducing part 701 and the vertical CCD part 702 should be divided in each cell to comprise the picture element. Thus, there is a trading off between two important fundamental characteristics: the sensitivity and the dynamic range. Furthermore, in the case of higher integration or further size reduction with the conventional configuration of the planar channel type CCD having a charge transfer channel in the silicon substrate, it becomes substantially impossible to secure an area sufficient for a mask region over the vertical CCD to stop the allowance of light entering thereto. Thus a smear is caused (, which is the unnecessary charge generated by light incident on a CCD part,) by the spurious signal.

OBJECT AND SUMMARY OF THE INVENTION

In order to solve the above-mentioned problems, the present invention was made by breaking through the conventional arts.

The present invention provides a novel and useful charge transfer device having very little smear, wherein a higher integration and a size reduction is achieved by utilizing the most modern level of DRAM manufacturing technology.

The charge transfer device in accordance with the present invention comprises:

a semiconductor substrate, insulation films formed on the semiconductor substrate, plural first semiconductor regions provided buried in the insulation films, plural second semiconductor regions, a tunneling insulation film provided between the first semiconductor regions and the second semiconductor regions, in a manner to spatially isolate them from each other, first control electrodes provided isolatedly under respective ones of the first semiconductor regions, for controlling their potentials, and second control electrodes provided isolatedly above respective ones of the second semiconductor regions, for controlling their potentials. (All examples of FIG. 1 through FIG. 33).

In the charge transfer device in accordance with the present invention, instead of the conventional way of transferring the electric charge in a transfer channel buried in the semiconductor substrate itself, the electric charges are transferred between plural semiconductor regions of silicon or polysilicon, etc., formed buried in thick insulative film(s) on the semiconductor substrate, forming a stack channel type CCD device. The transferring is made by controlling the voltages of control electrodes which thereby control the potentials of buried transfer regions.

The present invention provides a charge transfer device of a novel stacked channel type charge coupled device configuration. The maximum charge transfer amount of the semiconductor CCD of the stacked channel type CCD is determined by the channel capacitance rather than by the width of the channel. For instance, through the forming of a thinner insulation film and a higher integrated pattern by utilizing a modern DRAM manufacturing technology, an enlarged dynamic range becomes possible.

Furthermore, the stacked channel type CCD formed on a semiconductor substrate can be used in various kinds of devices in a manner as if it were signal wires, and the problem of smear is eliminated.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 3 is an energy band diagram showing the energy bands corresponding to various parts of the first embodiment shown in FIG. 1 an FIG. 2 a thermal equilibrium state.

FIG. 4 is an energy band diagram showing the energy bands of the first embodiment in a writing state.

FIG. 5 is an energy band diagram showing the energy bands of the first embodiment in the stored state.

FIG. 6 is an energy band diagram showing the energy bands of the first embodiment in the discharging state.

FIG. 7 is an energy band diagram showing the energy bands of the first embodiment in another thermal equilibrium state.

FIG. 8 is an energy band diagram showing the energy bands of the first embodiment in a transferring state.

FIG. 9 is an energy band diagram showing the energy bands of the first embodiment in another transferring state.

FIG. 11 and FIG. 11A are cross sectional elevation views taken at sectional plane XI—XI' shown in FIG. 10.

FIG. 14 is an energy band diagram showing the energy bands corresponding to various parts of the third embodiment shown in FIG. 12 and FIG. 13 in a thermal equilibrium state.

FIG. 15 is an energy band diagram showing the energy bands of the third embodiment in a writing state.

FIG. 16 is an energy band diagram showing the energy bands of the third embodiment in a stored state.

FIG. 17 is an energy band diagram showing the energy bands of the third embodiment in a discharging state.

FIG. 18 is an energy band diagram showing the energy bands of the third embodiment in another thermal equilibrium state.

FIG. 19 is an energy band diagram showing the energy bands of the third embodiment in a transferring state.

FIG. 20 is an energy band diagram showing the energy bands of the third embodiment in another transferring state.

FIG. 23 is an energy band diagram showing the energy bands corresponding to various parts of the embodiment shown in FIG. 21 and FIG. 23 in a thermal equilibrium state.

FIG. 24 is an energy band diagram showing the energy bands of the fourth embodiment in a writing state.

FIG. 25 is an energy band diagram showing the energy bands of the fourth embodiment in a stored state.

FIG. 26 is an energy band diagram showing the energy bands of the fourth embodiment in a discharging state.

FIG. 27 is an energy band diagram showing the energy bands of the fourth embodiment in another thermal equilibrium state.

FIG. 28 is an energy band diagram showing the energy bands of the fourth embodiment in a transferring state.

FIG. 29 is an energy band diagram showing the energy bands of the fourth embodiment in another transferring state.

It will be recognized that some or all of the figures are schematic representations for purposes of illustration and do not necessarily depict the actual relative sizes or locations of the elements shown.

DESCRIPTION OF THE PREFERRED EMBODIMENTS

Hereafter, the preferred embodiments of the present invention are described in detail with reference to the accompanying drawings.

Figure 1:
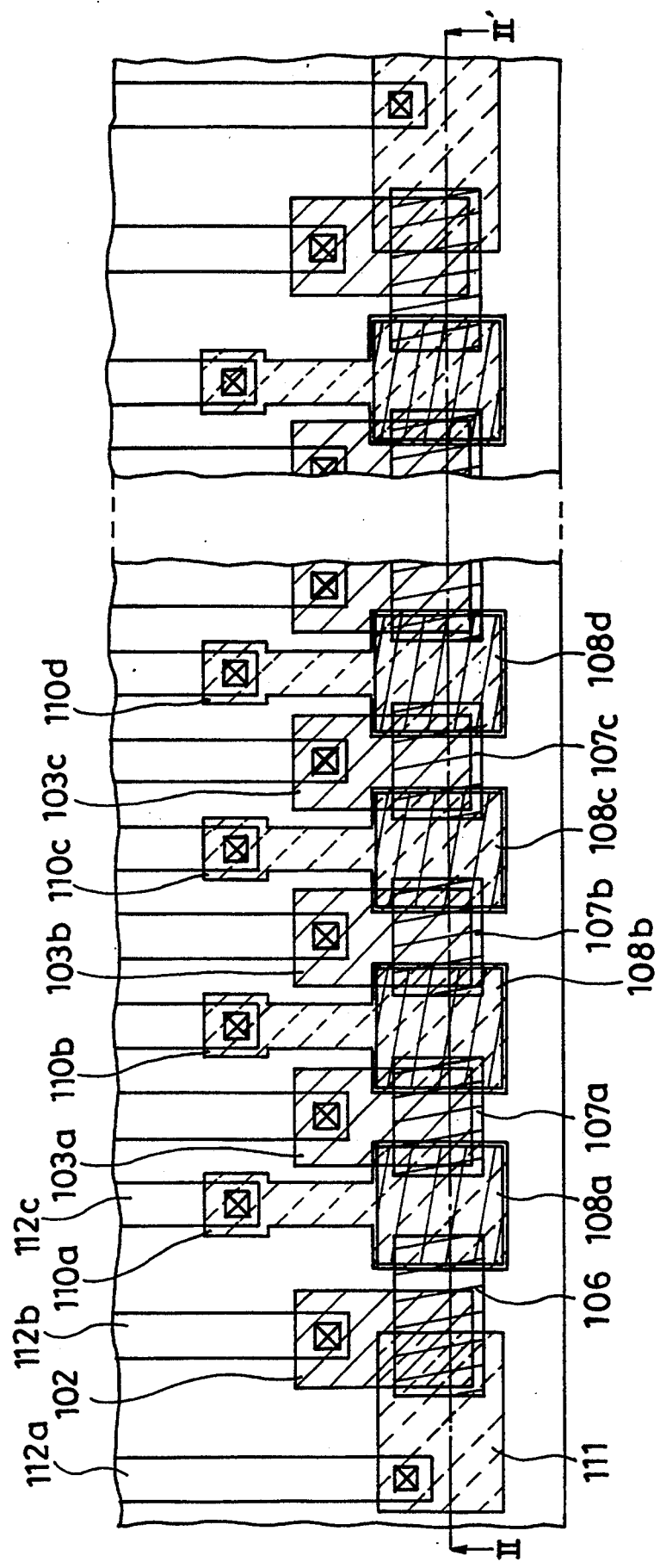
FIG. 1 is a plan view of a first preferred embodiment of the present invention.
Figure 2:
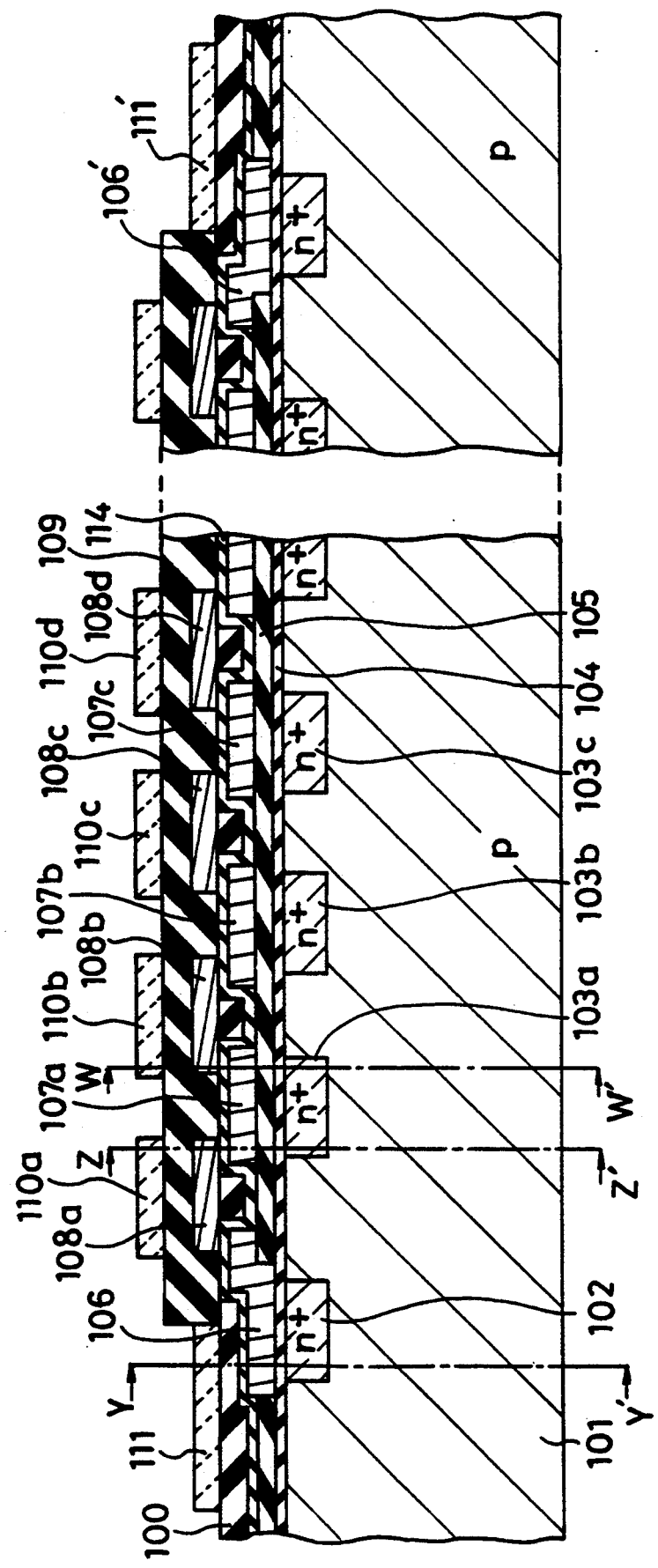
FIG. 2 is a cross sectional elevation view taken at sectional plane II—II' shown in FIG. 1.

FIG. 1 and FIG. 2 show a first preferred embodiment of the present invention, wherein FIG. is a plan view, and FIG. 2 is a cross sectional elevation view taken at sectional plane II—II' shown in FIG. 1. And FIG. 2A is a perspective view of the main components of the first embodiment shown omitting the insulation films.

As shown in FIG. 1 and FIG. 2, the device of the first embodiment is configurated as follows. On a p-type silicon substrate 101 (hereinafter simply p-substrate), an n+-region 102 as a charge injection source region, and a plurality of n+-regions 103a, 103b, 103c, ... as transfer electrodes are formed. Then, on the surface of the p-substrate 101, a first tunneling insulation film 104, and thereon, an insulation film 105 are formed in sequence. As the tunneling insulation film 104, a 100--100 Å thick gate oxide film or 20 Å thick silicon nitrite film is used. As the insulation film 105, a silicon dioxide film of 500--1000 Å thickness is used. On the insulation film 105, a plurality of first semiconductor regions, e.g. of poly-Si or single crystalline silicon regions 107a, 107b, 107c, ... of n-type are formed. At the same time, a first semiconductor region 106 of n-type as a charge input part is formed on the insulation film 105 and also in an opening made in the insulation film 105, so as to contact the first tunneling insulation film 104. The n-type regions 106, 107a, 107b, 107c ... and 106' are disposed over the n+-type regions 102, 103a, 103b, 103c, ..., respectively. Then, on the n-type regions 106, 107a, 107b, ... and on the insulation film 105 therebetween, a second tunneling insulation film 114 is formed, and further thereon a second insulation film 100 is formed. Thereafter, on the second insulation film 100, second semiconductor regions 108a, 108b, 108c, 108d, ... of poly-Si or n-type single crystalline silicon are formed in a manner that each second semiconductor region 108a, 108b, ... partly overlap end parts of the underlying first semiconductor regions 106, 107a, 107b, ... intermediating the second tunneling insulation film 114 therebetween. Then, after forming thereover a third insulation film 109, second control electrodes 110a, 110b, 110c, 110d, of poly-Si are formed over the positions corresponding to the underlying second semiconductor regions 108a, 108b, 108c, 108d, ..., respectively. At the same time, a charge input part control electrode 111 and a charge output part control electrode 111' are formed at one end and at the other end of the substrate in a manner to partly overlap the charge input first semiconductor region 106 and charge output first semiconductor region 106', respectively.

Thereafter, metal connection films 112a, 112b, 112c, 112d, ... of aluminum are formed in a manner to be connected to the aforementioned n+-regions 102, 103a, 103b, 103c, .... The charge output parts 111' and 106' are configured symmetrically to the charge input parts 111 and 106, but are disposed at the opposite end of the semiconductor substrate 101.

Figure 2A:
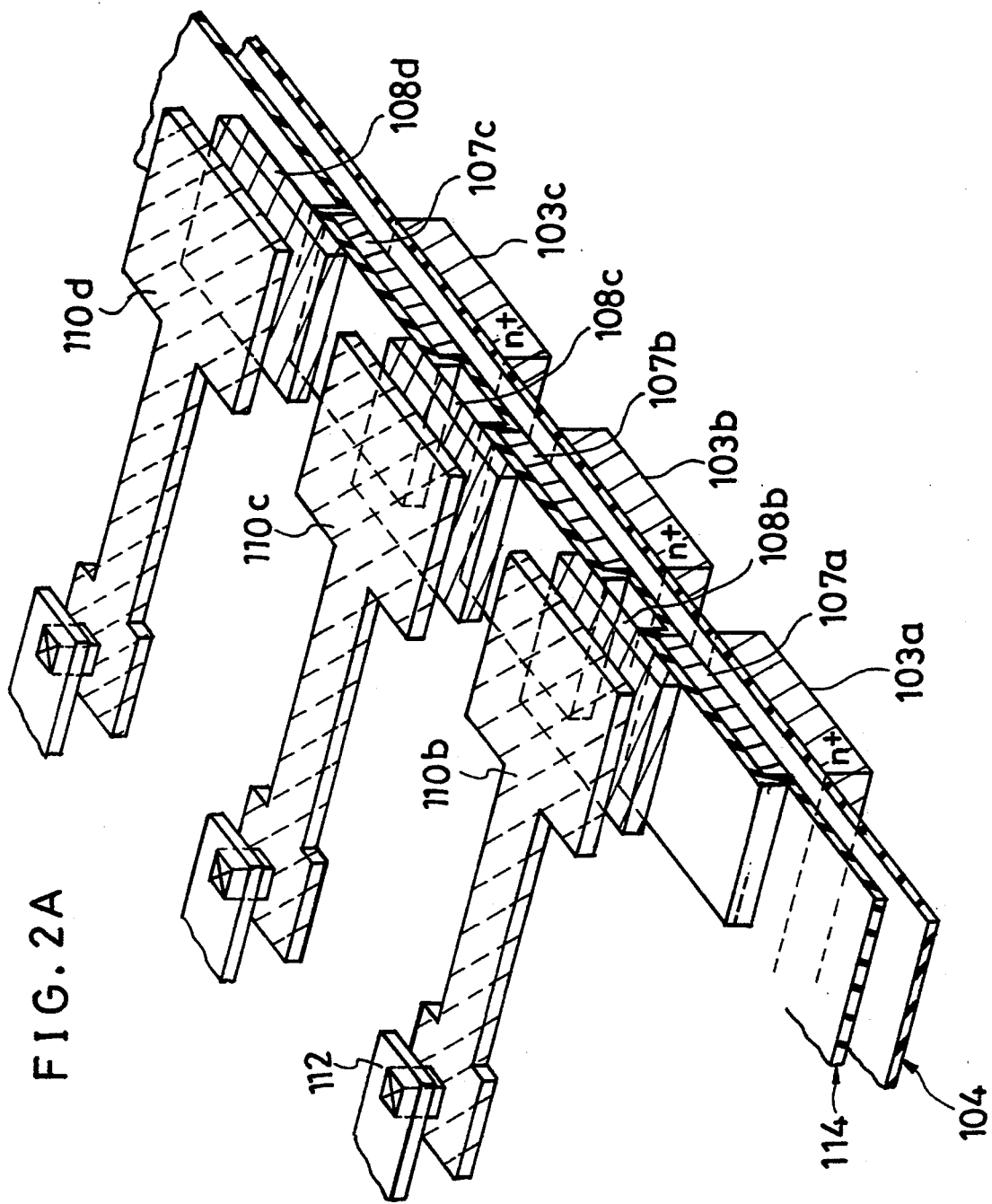
FIG. 2A is a perspective view of a principal part of the embodiment of FIG. 1 and FIG. 2.

The three dimensional configuration of the principle part of the above-mentioned charge transfer device is shown in FIG. 2A, wherein, for easier understanding of the corresponding parts to those shown in FIG. 1 and FIG. 2, similar reference numerals therewith are given to the corresponding parts.

The fundamental operation principle of the first embodiment shown by FIG. 1, FIG. 2 and FIG. 2A is now elucidated with reference to the energy band diagrams of FIG. 3 through FIG. 9.

FIG. 3 shows the energy band diagram in a thermal equilibrium state of the vertical sectional plane Y—Y' shown in FIG. 2. In FIG. 3 the positions from left to right show the energy control electrode 111 (having a band gap energy of Eg=1.1 eV), the second tunneling insulation film 114 and the insulation film 100 (Eg=8 eV), the first semiconductor region 106 (Eg=1.1 eV), the first tunneling insulation film 104 (Eg=8 eV) and the n+-region 102 (Eg=1.1 eV). In this diagram, the positive direction of the energy is shown downward.

FIG. 4 shows a similar energy band diagram of a "writing-in state" at the same vertical cross sectional plan Y—Y' of FIG. 2, and from left to right the same components as those of FIG. 3 are shown. FIG. 4 represents the writing-in state wherein electric charges are input from the n+-region 102 to the first semiconductor region 106.

When a positive voltage is impressed on the control electrode 111 and at the same time the n+-region 102 is set to 0 v, the first semiconductor region 106 which has hitherto been in a floating state is given a positive potential through a capacitive coupling. Therefore, by a known Fowler-Nordheim tunneling effect, electrons are injected from the n+-region 102 to the first semiconductor region 106.

FIG. 5 shows a similar energy band diagram of a "stored state" at the same vertical cross sectional plane Y—Y' of FIG. 2. In this state, n+-region 102 and the control electrode 111 are both set to 0 v, and therefore, the electrons which have been injected into the first semiconductor region 106 in a floating state remain in a stored state.

FIG. 6 shows a similar energy band diagram of a "discharging state" at the same vertical cross sectional plane Y—Y' of FIG. 2.

When a positive voltage is impressed on the n+-region 102 and at the same time the control electrode 111 is set to 0 v, the first semiconductor region 16 which has hitherto been in a floating state is given a positive potential through a capacitive coupling. Therefore, by the Fowler-Nordheim tunneling effect, the electrons are injected from the first semiconductor region 106 to the n+-region 102. Thus FIG. 6 is substantially inverse in the horizontal direction to FIG. 4, and shows that the same configuration as the charge input part is utilizable as the charge output part.

FIG. 7 shows a similar energy band diagram in "the thermal equilibrium state" at a vertical cross sectional plane Z—Z' (or W—W') of FIG. 2. (In the thermal equilibrium state, the energy band diagrams at both cross sectional planes Z—Z' and W—W' appear the same way, and hence, the numerals on FIG. 7 show only those of the cross sectional plane Z—Z'.) In FIG. 7, the positions from left to right show the second control electrode 110a (or 110b), the insulation film 100, the second semiconductor region 108a (or 108b), the first semiconductor region 107a (or 107b), the insulation film 105 plus the first tunneling insulation film 104, and the first control electrode 103a (or 103b) consisting of the n+-region.

FIG. 8 shows a similar energy band diagram of a transfer state at the vertical cross sectional plane Z—Z' of FIG. 2. When the second control electrode 110a is set at 0 v and a positive voltage V is impressed on the n+-region 103a as the first control electrode, owing to a capacitive coupling, the following relationship holds:

$$0 < V_2 < V_1 < V$$

where:

$V_1$ is the potential of the first semiconductor region 107a, $V_2$ is the potential of the second semiconductor region 108a, and V is the voltage impressed on the n+-region 103a as the first control electrode.

Therefore, by means of the Fowler Nordheim tunneling effect, the charge transfer from the second semiconductor region 108a to the first semiconductor region 107a is made.

FIG. 9 shows a similar energy band diagram of a transfer state at the vertical cross sectional plane W—W' of FIG. 2. When the n+-region 103a as the first control electrode is set at 0 v and a positive voltage V is impressed on the second control electrode 110a, owing to a capacitive coupling, the following relationship holds:

$$0 < V_1 < V_2 < V$$

where:

$V_1$ is the potential of the first semiconductor region 107a, $V_2$ is the potential of the second semiconductor region 108a, and V is the voltage impressed on the second control electrode 110a.

Therefore, by means of the Fowler Nordheim tunneling effect, the charge transfer from the first semiconductor region 107a to the second semiconductor region 108a is made.

By alternately repeating the charge transfer operations elucidated with reference to FIG. 8 and FIG. 9, the charge transfer of a stack channel type CCD is completed.

According to the above-mentioned first embodiment, the semiconductor regions 107a, 108a, 107b, 108b, ... are buried in the insulation films of the semiconductor region 101. In such stack channel type CCD, since the charge transfer regions 107a, 107b, ... 108a, 108b are formed in the insulation films 105+100+109 which are on the silicon substrate 101, the resulting CCD has the technical advantage that it hardly has any undesirable dark currents or smears attributable to the silicon substrate 101.

Figure 10:
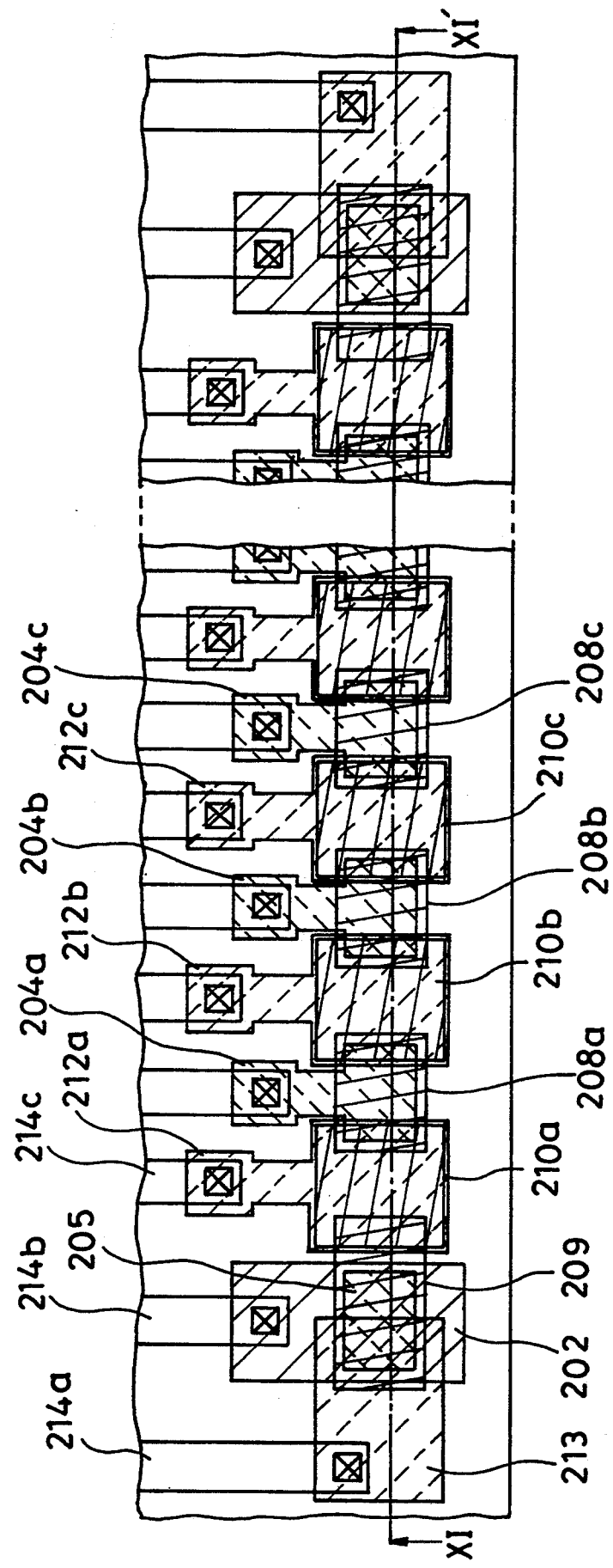
FIG. 10 is a plan view of a second preferred embodiment of the present invention.
Figure 11:
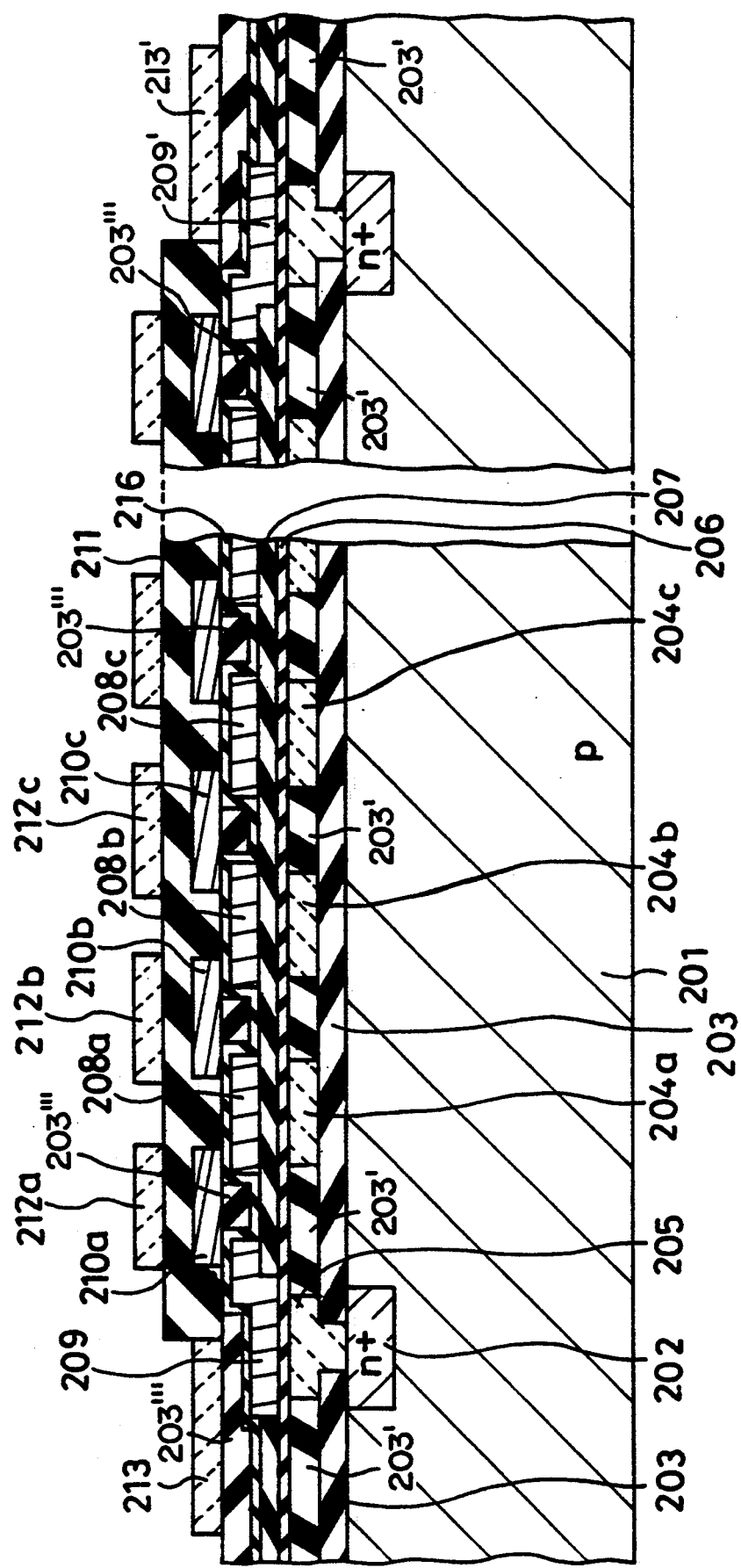

FIG. 10 is a plan view showing a configuration of a second embodiment of the present invention, and FIG. 11 is a cross sectional elevation view taken at sectional plane XI—XI' of FIG. 10. FIG. 11A is a perspective view of the main components of the second embodiment shown omitting the insulation films.

The main difference of this second embodiment from the first embodiment is that the first control electrodes 204a, 204b ... are provided apart from the first embodiment wherein these are in the semiconductor substrate, buried in an insulation film formed on the semiconductor substrate. That is, as shown in FIG. 10, which is a sectional elevation view at the sectional plane XI—XI' of FIG. 10, an n+-region 202 serving as a charge-injection source is formed on a p-type substrate 201. On the p-type substrate 201 and on the buried n+-type region 202, an insulation film 203 is formed, and further thereon, first control electrodes 204a, 204b, 204c, ... of poly-Si are formed, and at the same time an electrode 205 is formed so as to connect through a hole bored in the insulation film 203 to the n+-type region 202. Then, a first additional insulation film 203' is formed to fill recesses left between the electrodes 205, 204a, 204b, ... so as to make an even upper face together with those electrodes. Thereafter, a first tunneling insulation film 206 is formed, and thereon a second insulation film 207 is formed. Then, on the second insulation film 207, first semiconductor region 208a, 208b, 208c, ... are provided at respective positions above the first control electrodes 204a, 204b, 204c, ... ; and further a charge input part 209 made of the same semiconductor material as the first semiconductor region 209 is provided so as to contact through a hole bored in the second insulation film 207 so as to contact the first tunneling insulation film 206 at the position on the electrode 205. Subsequently, on respective n-type regions 209, 208a, 208b, 208c, ... and on the second additional insulation film 203", a second tunneling insulation film 216 is formed. And further thereon, a third additional insulation film 203''' is formed. Thereafter, on the third additional insulation 203''' and on the second tunneling insulation film 216, second semiconductor regions 210a, 210b, 210c, ... of poly-Si or N-type single crystalline silicon are formed in a manner that each second semiconductor regions 210a, 210b, 210c, ... partly overlap end parts of underlying semiconductor regions 208a, 208b, 208c, ... intermediating the second tunneling insulation film 216 therebetween. Then, after forming thereover a third insulation film 211, further thereon second control electrodes 212a, 212b, 212c, ... of poly-Si are formed, in a manner to be over the positions corresponding to the underlying second semiconductor regions 210a, 210b, 210c, -- respectively. At the same time, charge input part control electrodes 213 are formed at one end in a manner partly overlapping the charge input first semiconductor region 209.

Thereafter, metal connection films 214a, 214b, 214c, 214d, ... (shown in FIG. 10) of aluminum or gold are formed in a manner to be connected to the aforementioned first electrodes 205, 204a, 204b, 204c, .... The charge output parts 213' and 209' are configured symmetrically to the charge input parts 213+209, but are disposed at the opposite end of the semiconductor substrate.

The three dimensional configuration of the principle part of the above-mentioned charge transfer device is shown in FIG. 11A, wherein for easier understanding of the corresponding parts of those shown in FIG. 10 and FIG. 11, similar reference numerals therewith are given to the corresponding parts.

The fundamental principle of operation of the second embodiment shown in FIG. 10, FIG. 11 and FIG. 11a is substantially the same as that of the first embodiment shown in FIG. 1, FIG. 2 and FIG. 2a. The first control electrodes, the second control electrodes, the first semiconductor regions and the second semiconductor regions of these two embodiments correspond to each other as indicated in Table 1. The energy band diagrams of FIG. 3 through FIG. 9 similarly apply to the second embodiment.

TABLE 1

Table of Corresponding parts of First and Second Embodiments

| | First Embodiment | Second Embodiment |
|---|---|---|
| Second control electrode | 110a, 110b, ... | 212a, 212b, ... |
| Insulation film (middle) | 100 | 203" |
| Second semiconductor region | 108a, 108b, ... | 210a, 210b, ... |

TABLE 1-continued

Table of Corresponding parts of
First and Second Embodiments

|  | First Embodiment | Second Embodiment |
|---|---|---|
| First semiconductor region | 107a, 107a, ... | 208a, 208b, ... |
| First tunneling insulation film + Insulation film | 104 + 105<br>103a, 103b, ... | 206 + 207<br>204a, 204b, ... |
| First control electrode |  |  |

Since the charge transfer region is formed outside the semiconductor substrate, the resulting SC-CCD has a very small level of smear. In this second embodiment, both the transfer regions of the semiconductor CCD and the transfer electrodes are formed in the insulation film 203' on the silicon substrate 201, and hence they are further independent from the silicon substrate 201 in comparison with the first embodiment.

Figure 12:
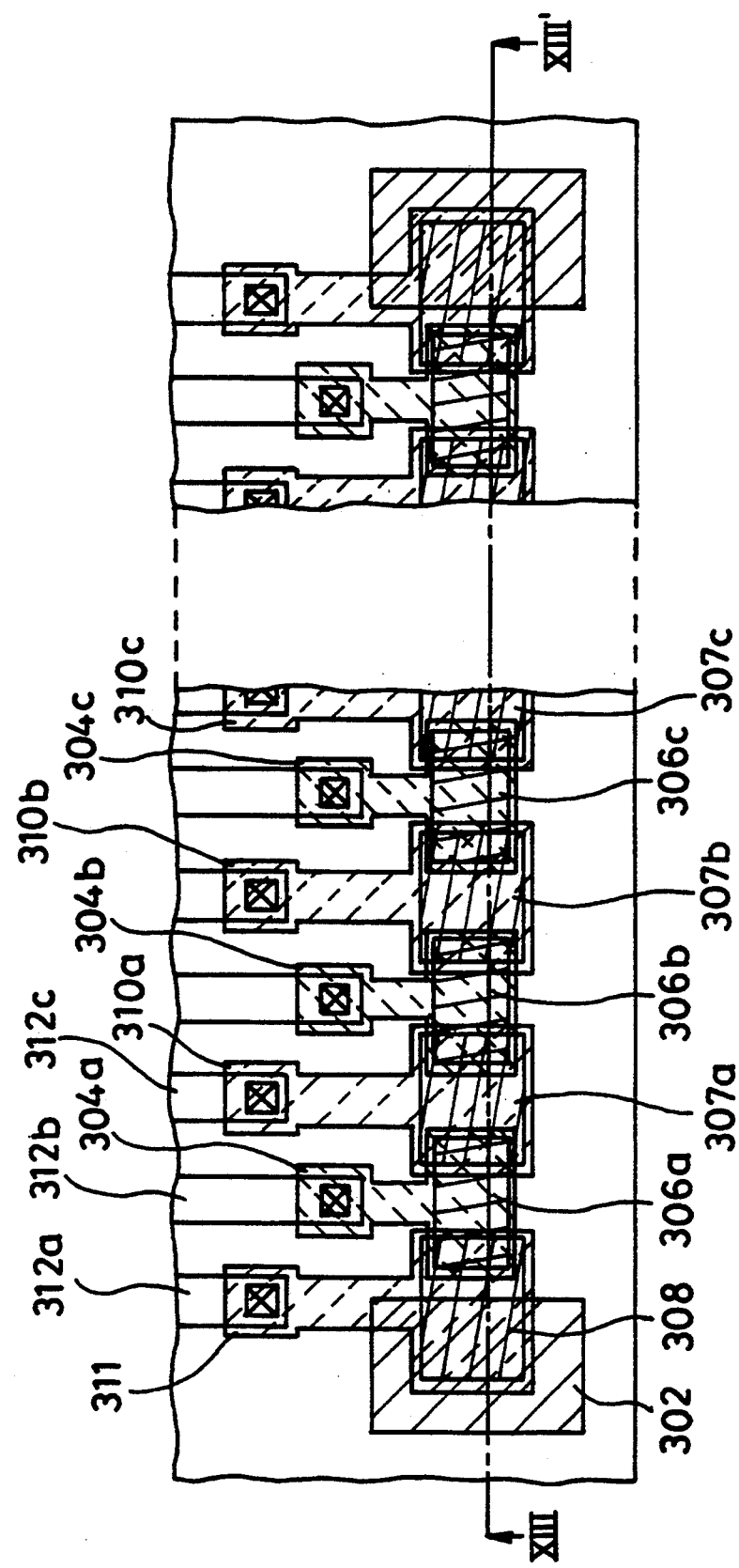
FIG. 12 is a plan view of a third preferred embodiment of the present invention.
Figure 13:
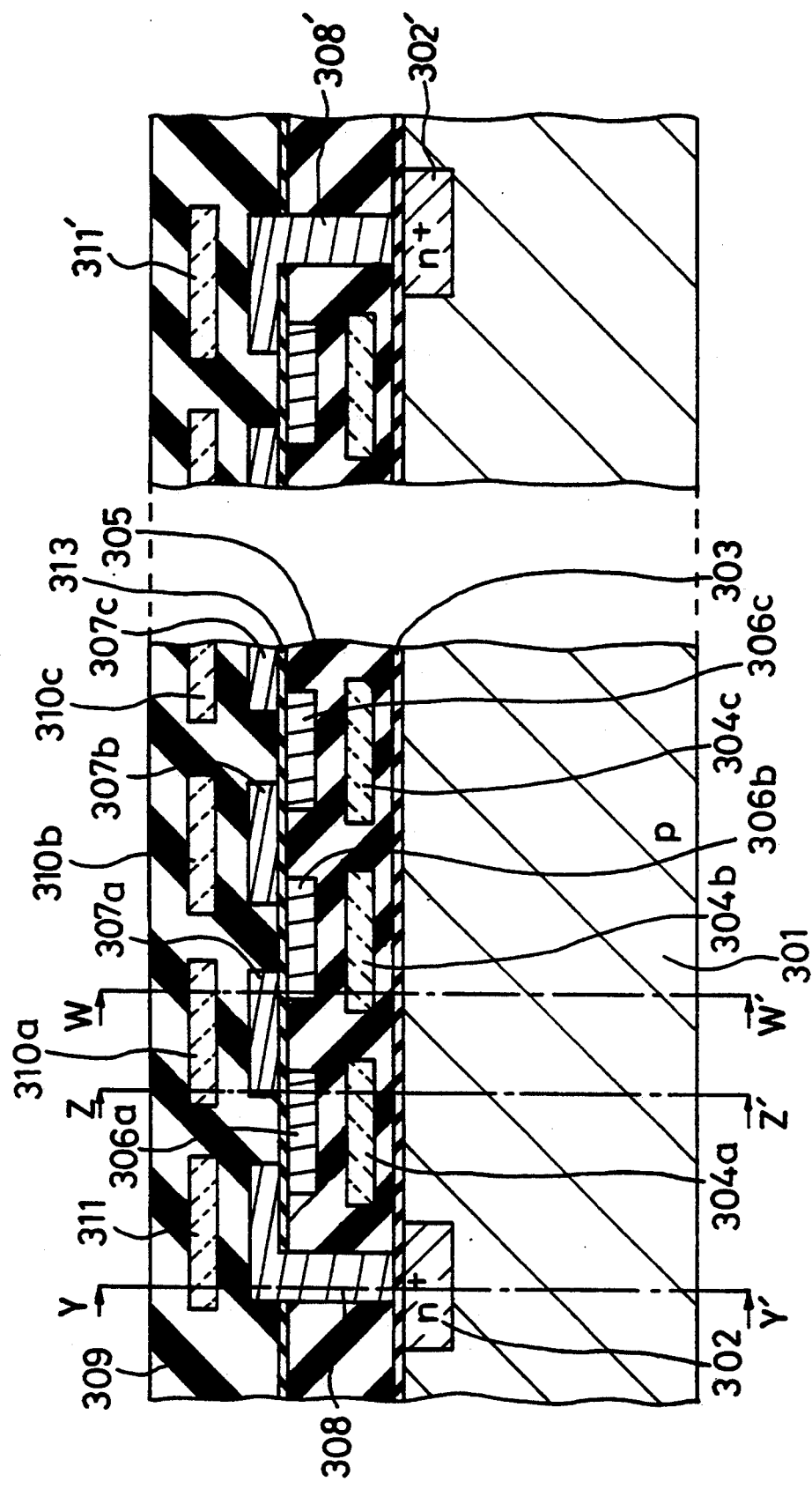
FIG. 13 is a cross sectional elevation view taken at sectional plane XIII—XIII' shown in FIG. 12.

FIG. 12 is a plan view showing a configuration of a third embodiment of the present invention, and FIG. 13 is a cross sectional elevation view taken at sectional plane XIII—XIII' in FIG. 12. Further, FIG. 13A is a perspective view of the main components of the third embodiment shown omitting the insulation films.

On a principal face of a p-type silicon substrate 301, an n-type region 302 is formed by selective diffusion to become a photoelectric conversion part, and on the principal face a first tunneling insulation film 303 is formed. As the tunneling insulation film 303, a 100--200 Å thick gate oxide film or a 20 Å thick silicon nitride film is used. Further thereon, a thick insulation film 305, for instance silicon oxide film, is formed. And in the insulation film 305, plural first control electrodes 304a, 304b, 304c, ... are formed of poly-Si. Further, also in the insulation film 305 and at respective positions above the first control electrodes 304a, 304b, 304c, ..., first semiconductor regions 306a, 306b, 306c, ... of poly-Si or single crystalline silicon are formed. Thereafter, on the upper surface of the first semiconductor regions 306a, ... and on the surface of the insulation film 305, a second tunneling insulation film 313 is formed. As the second tunneling insulation film 313, a 100--200 Å thick gate oxide film or a 20 Å thick silicon nitride film is used. Then, further thereon a plurality of second semiconductor regions 307a, 307b, 307c, ... of poly-Si or single crystalline silicon are formed in a manner to partly overlap the end parts of the underlying first semiconductor regions 306a, 306b, 306c, .... At the same time, at the input end (left end in FIG. 13) of the substrate a charge input part 308 of the second semiconductor region is formed so as to have one part lying on the second tunneling insulation film 313 and to have another part penetrating down onto the first tunneling insulation film 303 just above the n-type region 302. Thereafter an upper insulation film 309 is formed for instance of silicon oxide film, and therein, a plurality of second control electrodes 310a, 310b, 310c, ... and a charge input part control electrode 311 are formed in a manner to be isolated by the upper insulation film 309 and disposed isolatedly above the second semiconductor regions 307a, 307b, 307c, ... and above the horizontal part of the charge input part 308, respectively. In FIG. 12, numerals 312a, 312b, 312c, ... designate aluminum wiring film to be connected to the second controlling electrodes 310a, 310b, ... of poly-Si, and charge input part control electrode 311. Charge output parts 311' and 308' are configured symmetrically to the charge input parts 311 and 308, but are disposed at the opposite end (right end of FIGS. 12 and 13) of the semiconductor substrate.

Figure 13A:
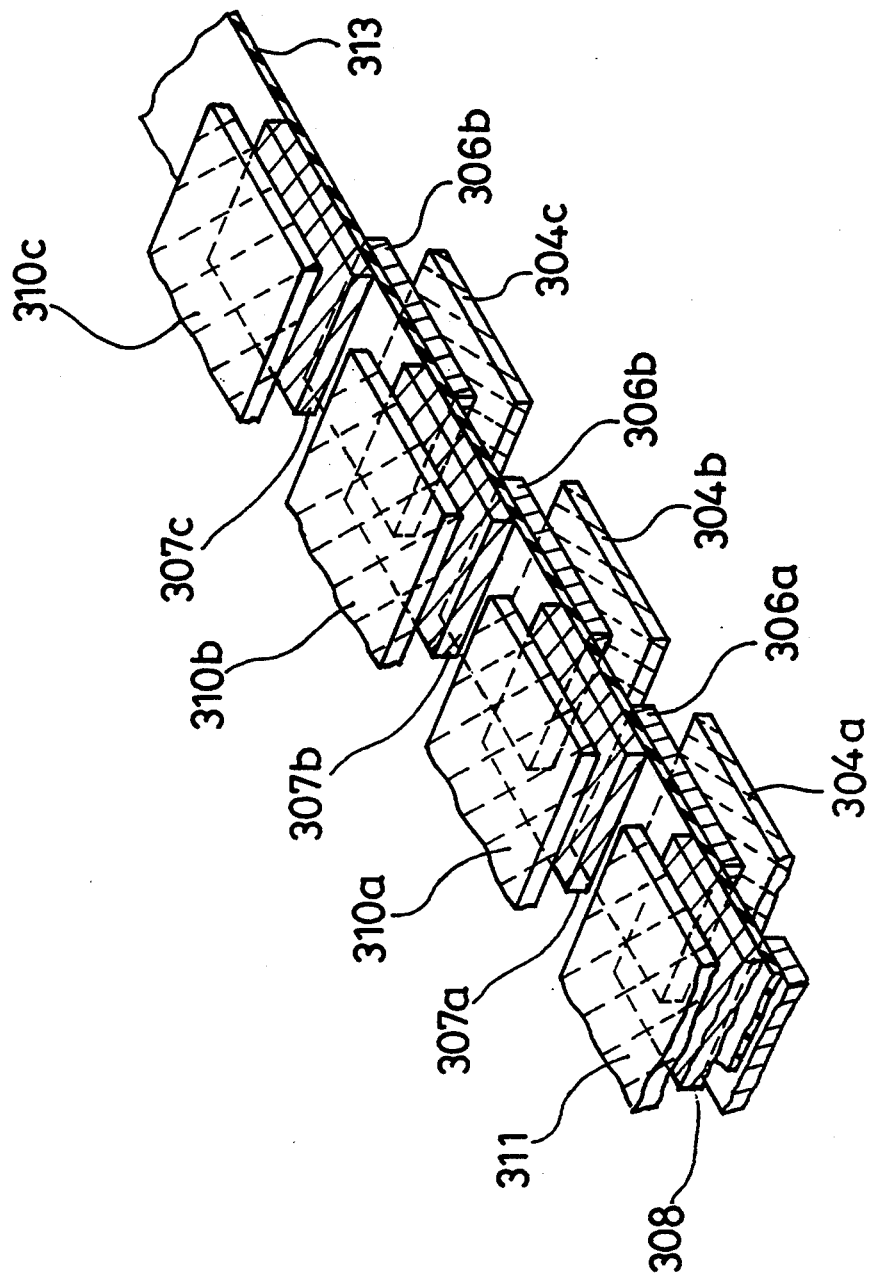
FIG. 13A is a perspective view showing the configuration of the third embodiment shown in FIG. 12 and FIG. 13.

The three dimensional configuration of the principle part of the above-mentioned charge transfer device is shown in FIG. 13a, wherein for easier understanding of the corresponding parts of those shown in FIG. 12 and FIG. 13, similar reference numerals therewith are given to corresponding parts.

The fundamental principle of operation of the third embodiment shown by FIG. 12 and FIG. 13 are now elucidated with reference to the energy band diagrams of FIG. 14 through FIG. 20.

FIG. 14 is an energy band diagram of a thermal equilibrium state at the vertical sectional plane Y—Y' shown in FIG. 13. In FIG. 14 the positions from left to right show the charge input control electrode 311 (having a band gap energy of Eg=1.1 eV), the upper insulation film 309 (Eg=8 eV), the charge input part 308 of the second semiconductor region (Eg=1.1 eV), the first tunneling insulation film 303 (Eg=8 eV) and the n+-region 302 (Eg=1.1 eV). In this diagram, a positive direction of energy is shown downward.

FIG. 15 shows a similar energy band diagram of a "writing-in state" at the same vertical cross sectional plane Y—Y' of FIG. 13. From left to right the same components as those of FIG. 14 are shown. FIG. 15 represents the writing-in state wherein electric charges are input from the n+-region 302 to the charge input part 308 of the second semiconductor region.

When a positive voltage is impressed on the control electrode 311 and at the same time the n+-region 302 is set to 0 v, the charge input part 308 of the second semiconductor region which has hitherto been in a floating state is given a positive potential through capacitive coupling. Therefore, by the known Fowler-Nordheim tunneling effect, electrons are injected from the n+-region 302 to the charge input part 308.

FIG. 16 shows a similar energy band diagram of a "stored state" at the same vertical cross sectional plane Y—Y' of FIG. 13. In this state, the n+-region 302 and the control electrode 311 are both set to 0 v, and therefore, the electrons which have been injected into the charge input part 308 of the second semiconductor region of the floating state remains in a stored state.

FIG. 17 shows a similar energy band diagram of a "discharging state" at the same vertical cross sectional plane Y—Y' of FIG. 13.

When a positive voltage is impressed on the n+-region 302 and at the same time the control electrode 311 is set to 0 v, the charge input part 308 of the second semiconductor region which has hitherto been in a floating state is given a positive potential through a capacitive coupling. Therefore, by the Fowler-Nordheim tunneling effect, electrons are injected from the charge input part 308 of the second semiconductor region to the n+-region 302. Thus FIG. 17 is substantially inverse in the horizontal direction to FIG. 15. This relationship shows that a same configuration as is used for the charge input part is utilizable as the charge output part.

FIG. 18 shows a similar energy band diagram of "a thermal equilibrium state" at the vertical cross sectional plane Z—Z' (or W—W') of FIG. 13. (In this thermal equilibrium state, the energy band diagrams at both cross sectional planes Z—Z' and W—W' appear the same, and hence, the reference numerals in FIG. 18 show only those elements of the cross sectional plane Z—Z'.) In FIG. 18, positions from let to right show the second control electrode 310a (or 310b), the upper insulation film 309, the second semiconductor region 307a (or 307b), the second tunneling insulation film 313, the first semiconductor region 306a (or 306b), the insulation film 305 and the first control electrode 304a (or 304b) consisting of poly-Si.

FIG. 20 shows a similar energy band diagram of a transfer state at the vertical cross sectional plane Z—Z' of FIG. 13. When the first control electrode 304a is set to 0 v and a positive voltage V is impressed on the second control electrode 310a, owing to a capacitive coupling, the following relationship holds:

$$0 < V_1 < V_2 < V$$

where:

$V_1$ is the potential of the first semiconductor region 306a.

$V_2$ is the potential of the second semiconductor region 307a, and

V is the voltage impressed on the second control electrode 310a.

Therefore, by means of the Fowler Nordheim tunneling effect, a charge transfer from the first semiconductor region 306a to the second semiconductor region 307a is made. by alternately repeating the change transferring of FIG. 19 and FIG. 20, charge transferring in a SC-CCD is realized.

According to the above-mentioned third embodiment, the semiconductor regions 306a, 307a, 306b, 307b, ... are buried in the insulation films 305, 309 on the semiconductor region 301. In such a stack channel type CCD, since the charge transfer regions 306a, 306b, ... 307a, 307b, ... are formed in the insulation films 305 and 309 which are on the silicon substrate 301, the resulting CCD has the technical advantage of minimal undesirable dark currents or smears attributable to the silicon substrate 301.

FIG. 13A is a perspective view showing a principal part of the third embodiment shown in FIG. 12 and FIG. 13, wherein signal charges are transferred 306A → 307A → 306B → 307B → 306C → 307C ... by channel transferring. In the case where the semiconductor regions 306A, 306B, ... and 307A, 307B, ... are of a low impurity concentration, i.e. close to being an intrinsic semiconductor, either electrons or positive holes can be transferred as signal charges.

Figure 21:
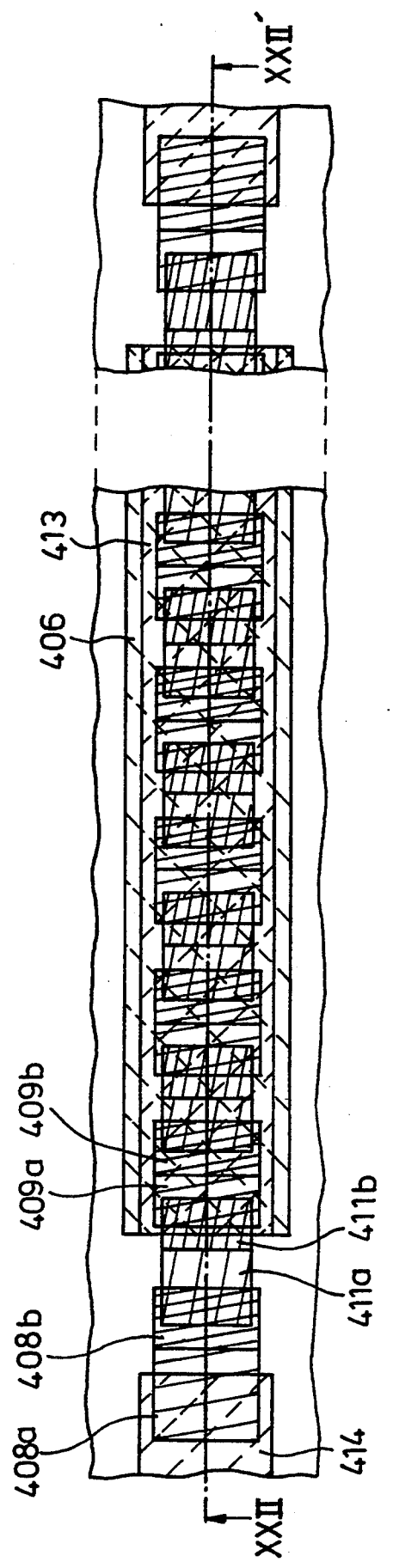
FIG. 21 is a plan view of a fourth preferred embodiment of the present invention.
Figure 22:
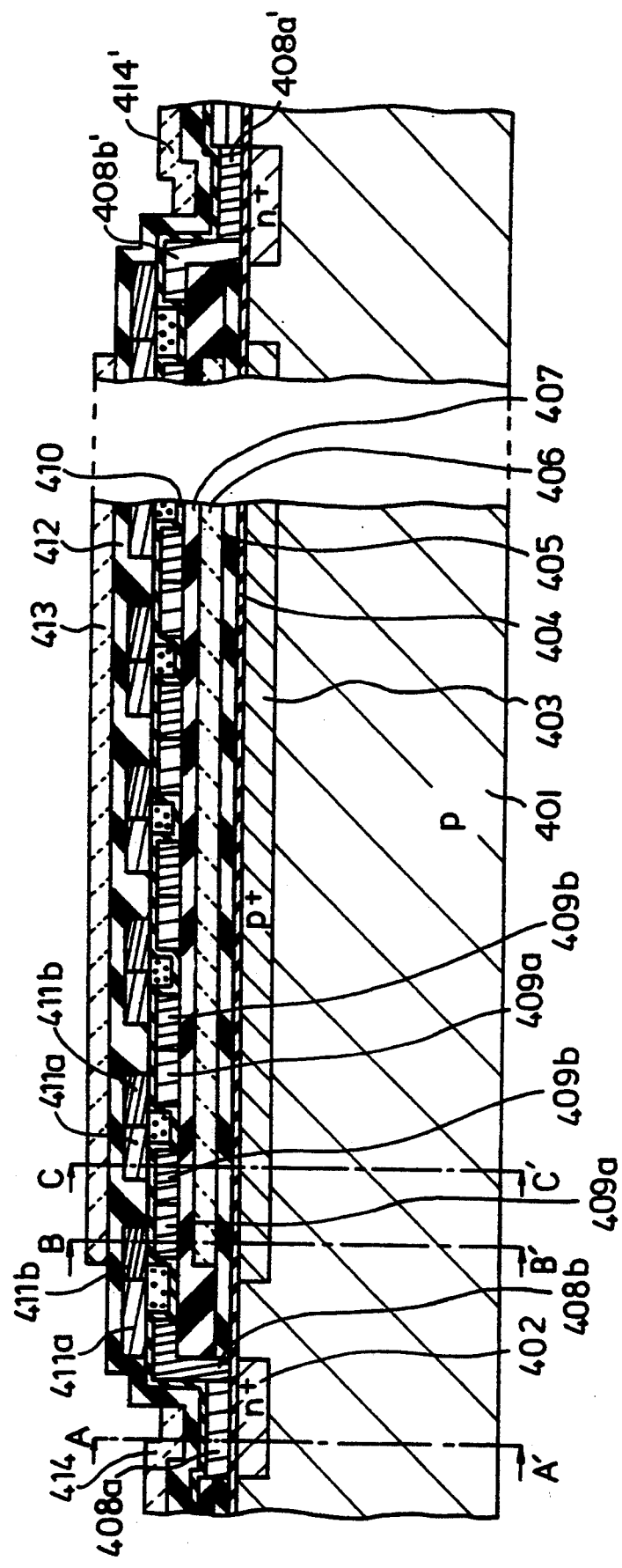
FIG. 22 is a cross sectional elevation view taken at sectional plane XXII—XXII' shown in FIG. 21.

FIG. 21 is a plan view showing a configuration of a fourth embodiment of the present invention, and FIG. 22 is a cross sectional elevation view taken at the sectional plane XXII—XXII' in FIG. 21.

On a principal face of a p-type silicon substrate 401, an n+-type charge injection region 402 and a p+-type region 403 to become a channel stopper are formed in sequence by selective diffusions, and further on the principal face a first tunneling insulation film 404 is formed. As the tunneling insulation film 404, a 100–200 Å thick gate oxide film or a 20 Å thick silicon nitride film is used. Further thereon, an insulation film 405, for instance silicon oxide film, is formed. On the insulation film 405, a first control electrode 406 is formed of poly-Si or single crystalline silicon. Thereon, an insulation film 407 is formed, and further thereon a plurality of first semiconductor regions 409a, 409b are formed making a row of blocks, each consisting of a lower n-type impurity concentration region 409a and a higher n-type impurity concentration region 409b. These semiconductor regions 409a, 409b are n-type polycrystalline silicon or a single crystalline silicon, and the higher n-type impurity concentration regions 409b are given higher n-type impurity concentrations than are the lower n-type impurity concentration regions 409a by ion-implantation or the like method. This is for the function that charges injected to each lower impurity concentration regions 409a move to each directly neighboring (i.e., contacting) higher impurity concentration regions 409b by means of a potential gradient. At the same time, at the input end (left end of FIG. 22) of the substrate a charge input part semiconductor region 408 of the same n-type semiconductor is formed in a manner that its upper part 408b reaches and lies on the insulation film 407 and its lower part 408a penetrates down the insulation film 407 onto the first tunneling insulation film 404 and opposes the n+-type charge injection region 402, intermediating the first tunneling insulation film 404 therebetween. The semiconductor regions 408a and 408b are n-type polycrystalline silicon, and the upper part 408b is made to have a higher n-type impurity concentration than the lower part 408a by ion-implantation or the like method. This is for the function that charges injected to the lower part 408a move to the upper part 408b by means of a potential gradient. Thereafter a second tunneling insulation film 410 is formed in a manner to rise and fall along the outer face of the respective blocks of lower and higher n-type impurity concentration regions 409a and 409b, thereby wrapping the blocks. As the second tunneling insulation film 410, a 100–200 Å thick gate oxide film or a 20 Å thick silicon nitrite film is use.

Thereafter, on the second tunneling insulation film 410, there are provided a second row of a plurality of semiconductor blocks, each consisting of a lower n-type impurity concentration region 411a and a higher n-type impurity concentration regions 411b. Similarly to the afore-mentioned row of semiconductor regions 409a and 409b, in the second row of semiconductor regions, the higher impurity concentration part 411b is made higher by ion implantation or the like method, and these regions are n-type polycrystalline silicon or single crystalline silicon. This is for the function that the charges injected into each lower impurity concentration region 411a moves to the higher impurity concentration region 411b, by means of a potential gradient.

Respective lower spaces between the blocks 409a and 409b of the lower semiconductor row and respective upper spaces between the blocks 411a and 411b of the upper semiconductor row are filled with an insulation film such as silicon dioxide.

The relative dispositions of the upper blocks of semiconductor regions 411a and 411b and the lower blocks of semiconductor regions 409a and 409b are such that each lower impurity concentration regions 411a and 409 a of a block is disposed at a position nearer to the input end (left end of FIG. 22) than the higher impurity concentration regions 411b and 409b of the block; and that each end part of the higher impurity concentration regions 411b 409b is partly overlapping, above or under intermediating the second tunneling insulation film 410 therebetween, the lower impurity concentration region 409a or 409a.

Then, on the row of upper blocks of semiconductor regions 411a and 411b, a thick insulation film 412 is formed, and thereon, a second control electrode (e.g. poly-Si) 413 is formed. At the same time, a charge input part electrode 414 and a charge output part electrode 414' are formed.

According to the above-mentioned configuration, the hitherto observed smear charge induced by carriers generated in a photoelectric transducer part of the semiconductor substrate 401 can not at all invade the semiconductor regions 408a and 408b or 411a and 411b; and therefore smear is not produced in principle. The smear charges which exist are made by the conversion of photons into electrons at the positions of 1 μm or more depth from the surface of the silicon substrate and stray into the CCD part. On the other hand, because the thicknesses of the impurity concentration regions 411a and 411b, 409a and 409b for containing electrons are very thin like the poly-Si electrodes, there is only very little possibility of photoelectric transducing to make carriers even if a visible light would happen to enter. Therefore, a light masking film (e.g. Al film) on the upper face of the CCD can be formed with a simple configuration.

The charge output parts 408a' and 408b' are configured symmetrically to the charge input parts 408a and 408b, but are disposed at the opposite end (right end of FIGS. 21 and 22) of the semiconductor substrate 401.

The fundamental principle of operation of the fourth embodiment shown in FIG. 21 and FIG. 22 are now elucidated with reference to the energy band diagrams of FIG. 23 through FIG. 29.

FIG. 23 is an energy band diagram of a thermal equilibrium state at a vertical sectional plane A—A' shown in FIG. 22. In FIG. 23 the positions from left to right show the energy of the control electrode 414 (having a band gap energy of Eg=1.1 eV), the insulation film 412 and the second tunneling insulation film 410 (Eg=8 eV), the charge input part semiconductor region 408a (Eg=1.1 eV), the first tunneling insulation film 404 (Eg=8 eV), and the n+-region 402 (Eg=1.1 eV). In this diagram, the positive direction of the energy is shown downward.

FIG. 24 shows a similar energy band diagram of a "writing state" at the same vertical cross sectional plane A—A' of FIG. 22 and from left to right the same components as those of FIG. 23 are shown. FIG. 24 represents the writing state wherein electric charges are input from the n+-region 402 to the charge input part semiconductor region 408a.

When a positive voltage is impressed on the control electrode 414 and at the same time the n+-region 402 is set to 0 v, the charge input part semiconductor region 408a which has hitherto been in a floating state is given a positive potential through a capacitive coupling. Therefore, by the known Fowler-Nordheim tunneling effect, electrons are injected from the n+-region 402 to the charge input part semiconductor region 408a.

FIG. 25 shows a similar energy band diagram of a "stored state" at the same vertical cross sectional plane A—A' of FIG. 22. In this state, the n+-region 402 and the control electrode 414 are both set to 0 v, and therefore, the electrons which have been injected into the charge input part semiconductor region 408a remains in a stored state.

FIG. 26 shows a similar energy band diagram of a "discharging state" at the same vertical cross sectional plane A—A' of FIG. 22.

When a positive voltage is impressed on the n+-region 402 and at the same time the electrode 414 is set to 0 v, the charge input part semiconductor region 408a which has hitherto been in a floating state is given a positive potential through a capacitive coupling. Therefore, by the Fowler-Nordheim tunneling effect, electrons are injected from the charge input part semiconductor region 408a to the n+-region 402. Thus FIG. 26 is substantially inverse in the horizontal direction to FIG. 24, and this relationship shows that the same configuration used as the charge input parts 408a and 408b is utilizable as the charge output parts 408a' and 408b'.

FIG. 27 shows a similar energy band diagram of a "thermal equilibrium state" at the vertical cross sectional plane C—C' (or B—B') of FIG. 22. (In this thermal equilibrium state, the energy band diagrams at both cross sectional planes C—C' and B—B' appear the same, and hence, the reference numerals of FIG. 27 reference only those elements of the cross sectional plane C—C'.) In FIG. 27, positions from left to right show the second control electrode 413, the insulation film 412, the second semiconductor region 411a (or 411b), the second tunneling insulation film 410, the first semiconductor region 409b (or 409a), the insulation film 407 and the first control electrode 406 which is of poly-Si.

FIG. 28 shows a similar energy band diagram of a transfer state at the vertical cross sectional plane B—B' of FIG. 22. When the second control electrode 413 is set at 0 v and a positive voltage V is impressed on the n+-region 402 as the first control electrode 406, owing to a capacitive coupling, the following relationship holds:

$$0<V_2<V_1<V$$

where:

$V_1$ is the potential of the first semiconductor region 409a, $V_2$ is the potential of the second semiconductor region 411b, and V is the voltage impressed on the n+-region 402 as the first control electrode 406.

Therefore, by means of the Fowler Nordheim tunneling effect, a charge transfer from the second semiconductor region 411b to the first semiconductor region 409a is made.

FIG. 29 shows a similar energy band diagram of a transfer state at the vertical cross sectional plane C—C' of FIG. 22. When the first control electrode 406 is set at 0 v and a positive voltage V is impressed on the second control electrode 413, owing to a capacitive coupling, the following relation holds:

$$0<V_1<V_2<V$$

where:

$V_1$ is the potential of the first semiconductor region 409b, $V_2$ is the potential of the second semiconductor region 411a, and V is the voltage impressed on the second control electrode 413.

Therefore, by means of the Fowler Nordheim tunneling effect, a charge transfer from the first semiconductor region 409b to the second semiconductor region 411a is made.

By alternately repeating the charge transferring of FIG. 28 and FIG. 29, charge transferring in a SC—CCD is realized.

Figure 30:
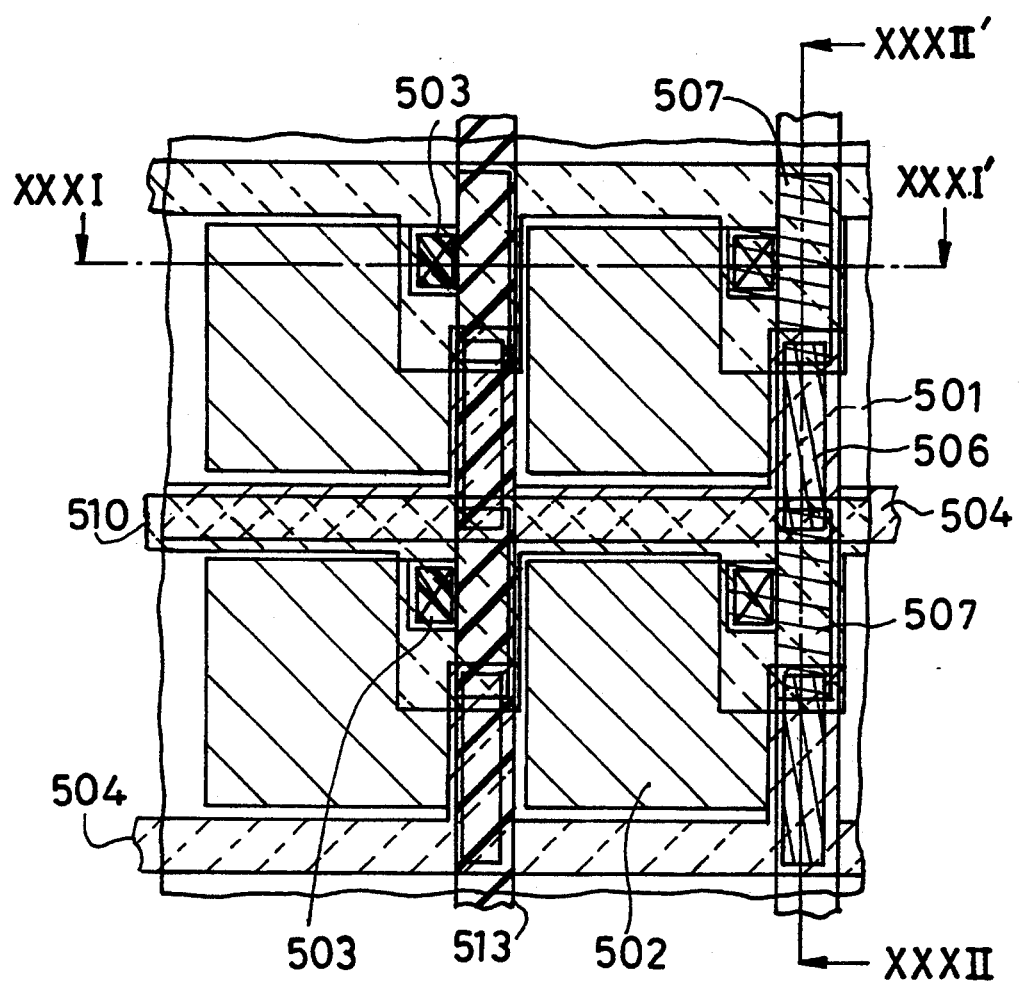
FIG. 30 is a plan view of a pixel part configuration of a CCD imaging device of two-dimensional pixel disposition using the third embodiment of the present invention.
Figure 31:
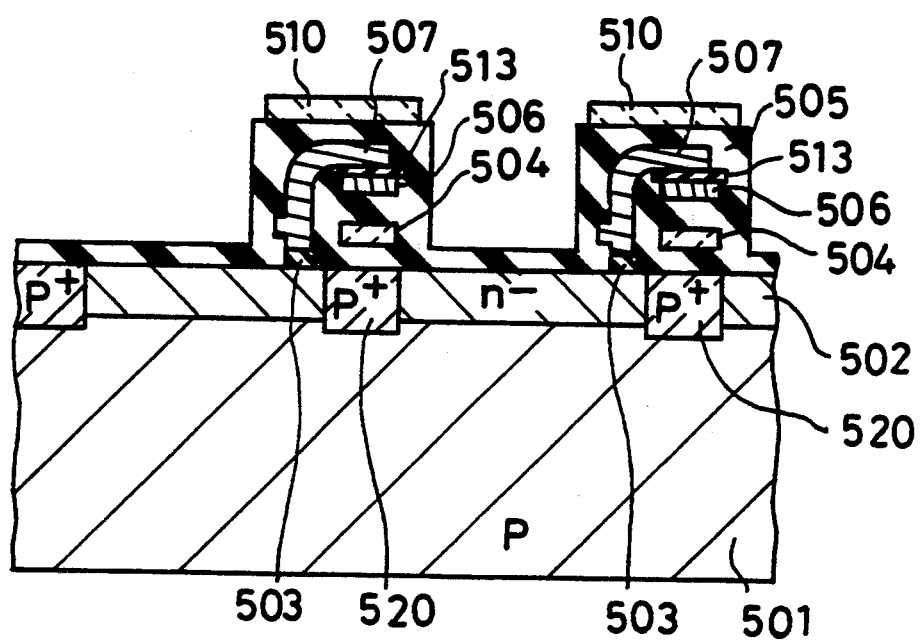
FIG. 31 and FIG. 32 are cross sectional elevation views taken at sectional planes XXXI—XXXI' and XXXII—XXXII' shown in FIG. 30, respectively.
Figure 32:
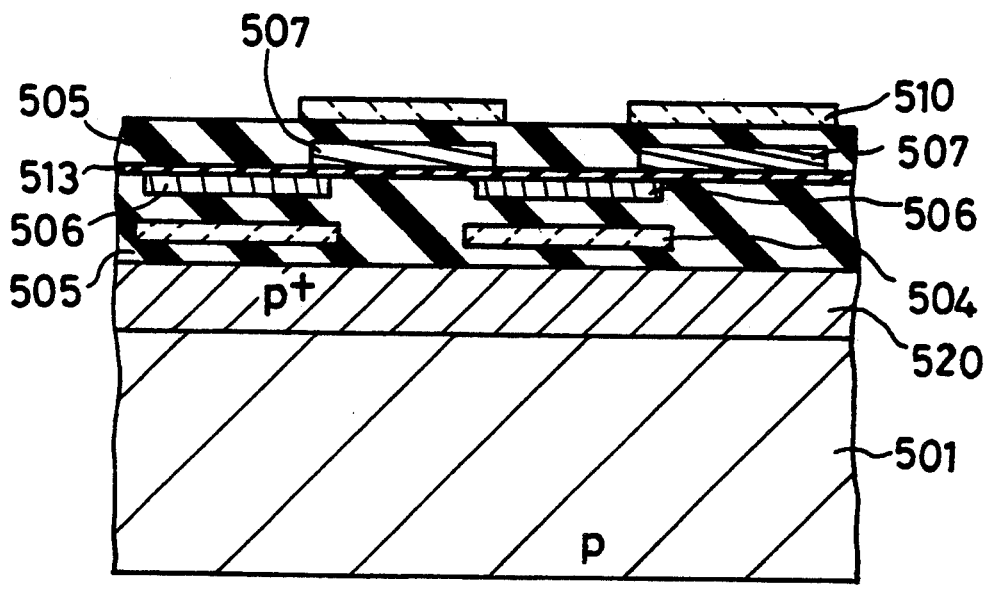
Figure 33:
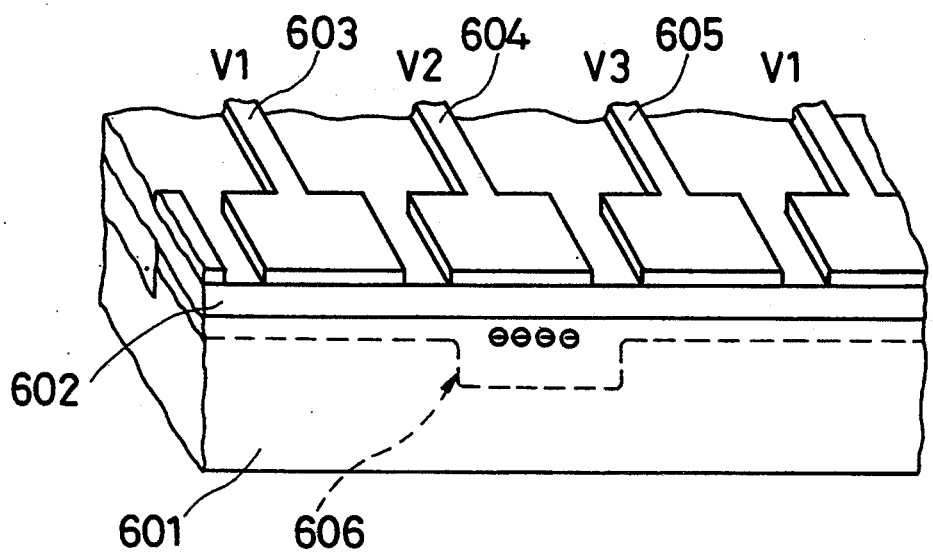
FIG. 33 and FIG. 34 are perspective view of the conventional planar type CCD showing configuration and operation thereof.
Figure 34:
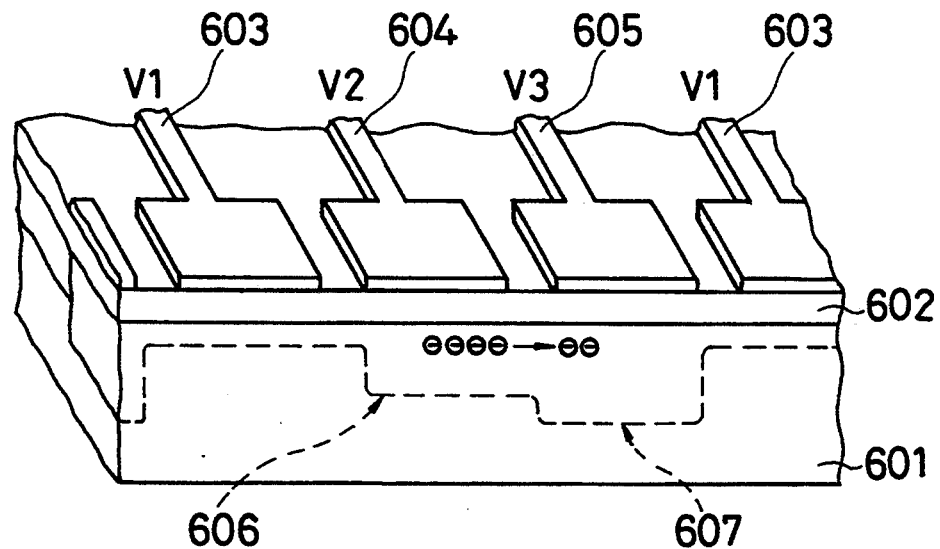
Figure 35:
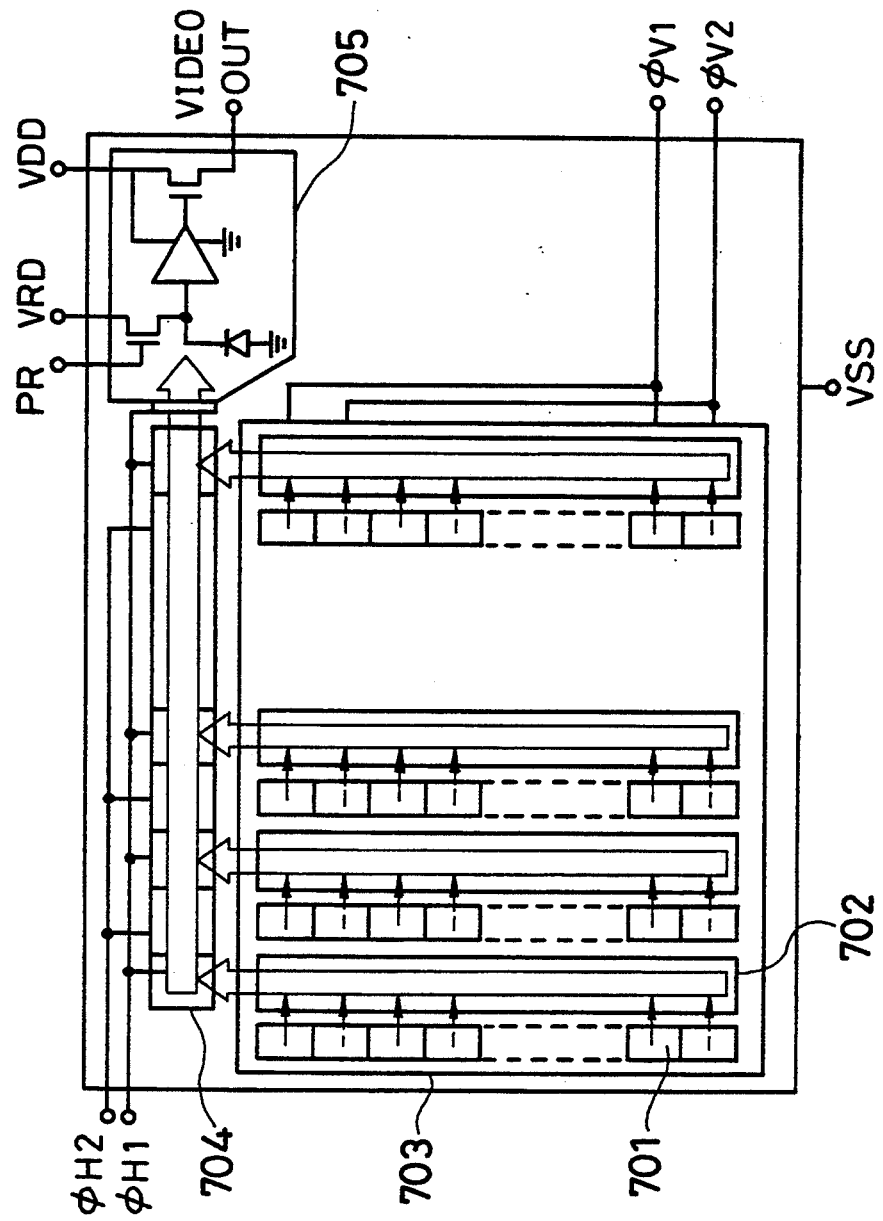
FIG. 35 is a plan view showing the disposition of a conventional CCD imaging device having a planar type vertical CCD.
Figure 36:
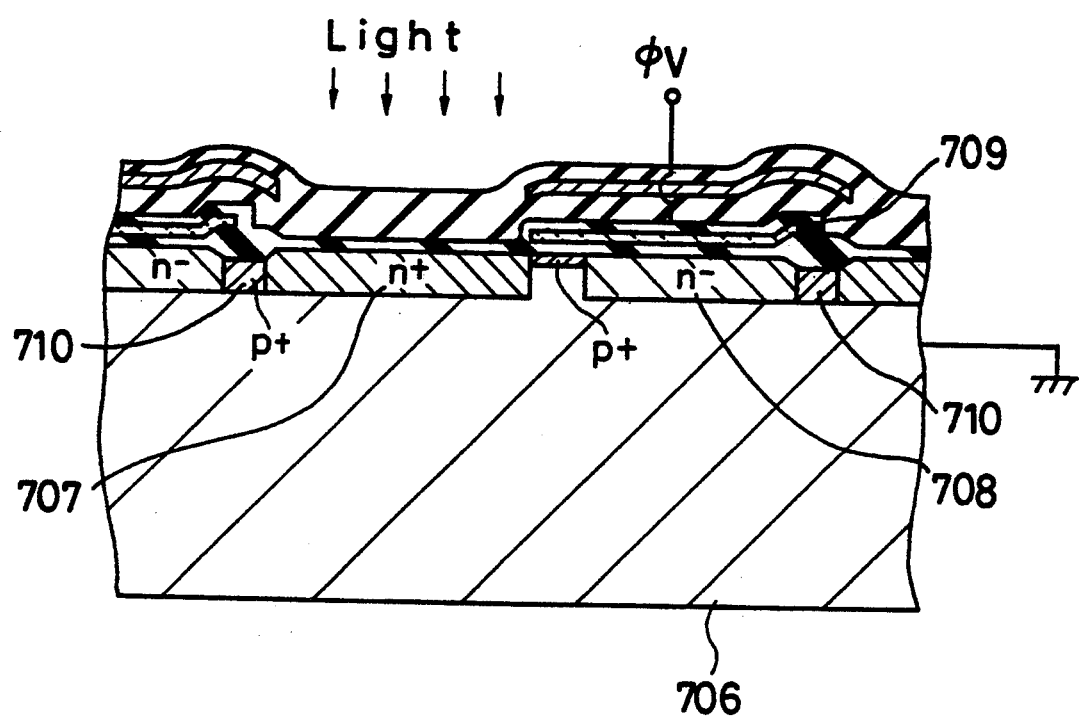
FIG. 36 is an enlarged cross sectional elevation view of a pixel part of a conventional CCD imaging device having the planar type vertical CCD of FIG. 35.

FIG. 30 through FIG. 32 show the embodiment of a pixels part of an interline type transfer CCD imaging device whereto the stack channel type CCD configuration of the aforementioned third embodiment is applied at the vertical CCD. FIG. 30 is a plan view of the pixels part, FIG. 31 is a cross sectional elevation view taken at the sectional plane XXXI—XXXI' shown in FIG. 30. FIG. 32 is a cross sectional elevation view taken at the sectional plane XXXII—XXXII' shown in FIG. 30.

As shown in these figures, on a P-type substrate 501, an N-type semiconductor region 502 of a photoelectric conversion part 502 is formed. A part of the N-type semiconductor region 502 is disposed to oppose the second semiconductor region 507 intermediating the first tunneling insulation film 503 therebetween, as shown in FIG. 30. Above the second semiconductor region 507, the second control electrode 510 is formed isolatedly therefrom on the insulation film 505 as shown in FIG. 32. Under the second semiconductor region 507 and beneath the second tunneling insulation film 513, the first semiconductor region 506 is provided partly overlapping in plan view at respective ends thereof. Furthermore, under the first semiconductor region 506, the first control electrode 504 is provided isolatedly in the insulation film 505. That is, in the thick insulation film 505 the above-mentioned first control electrode 504, the first semiconductor region 506, the second semiconductor region 507 and the second control electrode 510 are disposed in each other isolatedly relation.

The operation of this fifth embodiment is substantially the same as the conventional CCD, and therefore the operation is elucidated only to its essential part.

When a write-in pulse voltage that is a voltage larger than the transfer voltage is applied to the second control electrode 510 by means of a capacitive coupling, charges from the N-type semiconductor region 502 are transferred in the second tunneling insulation film 503 and the transferred charges are written in the second semiconductor region 507. Therefore, when a transferring pulse is applied to the first control electrode 504, the charges of the second semiconductor region 507 are transferred through the second tunneling insulation film 513 to the first semiconductor region 506. Subsequently, when another transferring pulse is applied to the second control electrode 510, the charges in the first semiconductor region 506 are transferred through the second tunneling insulation film 513 to the second semiconductor region 507. By repeating the above-mentioned operations, the CCD transfer operation is realized in this stack channel type CCD.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A charge transfer device comprising:
a semiconductor substrate;
a first insulation film formed on said semiconductor substrate;
a plurality of first semiconductor regions provided on said first insulation film;
a tunneling second insulation film provided on said first semiconductor region;
a plurality of second semiconductor regions formed on said tunneling insulation film, said tunneling insulation film spacially isolating said first semiconductor regions from said second semiconductor regions;
a plurality of first control electrodes provided under respective ones of said first semiconductor regions for controlling a potential of said first semiconductor regions; and
a plurality of second control electrodes provided above respective ones of said second semiconductor regions for controlling a potential of said second semiconductor regions.

2. A charge transfer device comprising:
a semiconductor substrate;
a tunneling first insulation film formed on said semiconductor substrate;
a second insulation film formed on said first tunneling insulation film;
a plurality of first semiconductor regions on said insulation film in a charge transferring direction;
a tunneling third insulation film formed over said first semiconductor regions;
a plurality of second semiconductor regions on said tunneling third insulation film in said charge transferring direction, said second semiconductor regions interleaving with said first semiconductor regions, and said first semiconductor regions being spacially isolated from said second semiconductor regions by said tunneling third insulation film;
a plurality of first control electrodes provided under said tunneling first insulation film at respective positions under said first semiconductor regions, for controlling a potential of said first semiconductor regions; and
a plurality of second control electrodes provided above respective ones of said second semiconductor regions, for controlling a potential of said second semiconductor regions.

3. A charge transfer device comprising:
a semiconductor substrate;
a first insulation film formed on said substrate;
a tunneling second insulation film formed on said first insulation film;
a third insulation film formed on said first tunneling second insulation film;
a plurality of first semiconductor regions on said third insulation film in a charge transferring direction;
a tunneling fourth insulation film formed over said first semiconductor regions;
a plurality of second semiconductor regions on said tunneling third insulation film in said charge transferring direction in a manner interleaving with said first semiconductor regions, said tunneling fourth insulation film being spatially isolating said first semiconductor regions from said second semiconductor regions;
a plurality of first control electrodes provided under said tunneling first insulation film at respective positions under said first semiconductor regions for controlling a potential of said first semiconductor regions; and
a plurality of second control electrodes provided above respective ones of said second semiconductor regions for controlling a potential of said second semiconductor regions.

4. A charge transfer device comprising:
a semiconductor substrate;
a tunneling first insulation film formed on said semiconductor substrate;
a second insulation film formed on said tunneling first insulation film;
a plurality of first semiconductor regions on said second insulation film in a charge transfer direction;
a tunneling third insulation film formed over said first semiconductor regions;
a plurality of second semiconductor regions on said tunneling third insulation film in said charge transfer direction in a manner interleaving with said first semiconductor regions, said tunneling third insulation film spatially isolating said first semiconductor regions from said second semiconductor regions;
a plurality of first control electrodes provided at respective positions under said first semiconductor regions for controlling a potential of said first semiconductor regions; and
a plurality of second control electrodes provided above respective ones of said second semiconductor regions for controlling a potential of said second semiconductor regions.

5. A charge transfer device comprising:
a semiconductor substrate;
a tunneling first insulation film formed on said semiconductor substrate;
a second insulation film formed on said tunneling first insulation film;
a plurality of first semiconductor regions on said second insulation film in a charge transfer direction;
a tunneling third insulation film formed over said first semiconductor regions;
a plurality of second semiconductor regions on said tunneling third insulation film in said charge transfer direction in a manner interleaving with said first semiconductor regions, said tunneling third insulation film spatially isolating said first semiconductor regions from said second semiconductor regions;
a first control electrode provided under said first semiconductor regions for controlling a potential of said first semiconductor regions; and
a second control electrode provided above said second semiconductor regions for controlling a potential of said second semiconductor regions.

6. A charge transfer device in accordance with claim 5 wherein:
said first semiconductor regions consist of first low concentration regions and first high concentration regions; and
said second semiconductor regions consist of second low concentration regions and second high concentration regions.

7. A charge transfer device comprising:
a semiconductor substrate;
a plurality of photoelectric transducers on said semiconductor substrate;
a first insulation film formed on said semiconductor substrate;
a plurality of first semiconductor regions provided on said insulation film;
a tunneling second insulation film provided over said first semiconductor regions;
a plurality of second semiconductor regions provided over said insulation film, said tunneling second insulation film spatially isolating said first semiconductor regions from said second semiconductor regions;
a plurality of first control electrodes provided under said first semiconductor regions for controlling a potential of said first semiconductor regions; and
a plurality of second control electrodes provided above said second semiconductor regions, for controlling a potential of said second semiconductor regions.

* * * * *